(12) United States Patent
Choi et al.

(10) Patent No.: US 9,985,162 B2
(45) Date of Patent: May 29, 2018

(54) SOLAR CELL AND METHOD FOR MANUFACTURING THE SAME

(75) Inventors: Wonseok Choi, Seoul (KR); Heonmin Lee, Seoul (KR); Junghoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1090 days.

(21) Appl. No.: 13/216,109

(22) Filed: Aug. 23, 2011

(65) Prior Publication Data

US 2012/0048371 A1    Mar. 1, 2012

(30) Foreign Application Priority Data

Aug. 25, 2010 (KR) .......................... 10-2010-0082606

(51) Int. Cl.
*H01L 31/0747*    (2012.01)
*H01L 31/18*      (2006.01)

(52) U.S. Cl.
CPC ...... *H01L 31/0747* (2013.01); *H01L 31/1804* (2013.01); *Y02E 10/547* (2013.01); *Y02P 70/521* (2015.11)

(58) Field of Classification Search
CPC . H01L 31/0747; H01L 31/1804; Y02E 10/52; Y02E 10/547
USPC ................... 136/252, 255, 258, 261
See application file for complete search history.

(56) References Cited

U.S. PATENT DOCUMENTS

| | | | | |
|---|---|---|---|---|
| 4,226,898 A | * | 10/1980 | Ovshinsky et al. | ........... 438/483 |
| 4,253,882 A | * | 3/1981 | Dalal | ........................... 136/249 |
| 5,726,065 A | * | 3/1998 | Szlufcik | .......... H01L 31/022425 |
| | | | | 136/256 |
| 6,130,380 A | * | 10/2000 | Nakamura | ...... H01L 31/022425 |
| | | | | 136/255 |
| 2007/0023081 A1 | * | 2/2007 | Johnson et al. | ............... 136/258 |
| 2008/0000521 A1 | * | 1/2008 | Sivoththaman | ......... C30B 25/02 |
| | | | | 136/254 |
| 2009/0280597 A1 | * | 11/2009 | Wijekoon | ......... H01L 21/30608 |
| | | | | 438/71 |

(Continued)

FOREIGN PATENT DOCUMENTS

JP              2846704 B2  *  1/1999
KR    1999-0063990 A      7/1999

(Continued)

OTHER PUBLICATIONS

English machine translation of JP 2846704 B2.*

*Primary Examiner* — Lindsey Bernier
(74) *Attorney, Agent, or Firm* — Birch, Stewart, Kolasch & Birch, LLP

(57) ABSTRACT

A solar cell includes a substrate containing a first impurity of a first conductivity type and made of a crystalline semiconductor, an emitter region positioned on the substrate and containing a second impurity of a second conductivity type different from the first conductivity type, the emitter region being made of a non-crystalline semiconductor, a surface field region positioned on the substrate and containing a third impurity of the first conductivity type, the surface field region being made of non-crystalline semiconductor, a first electrode connected to the emitter region, and a second electrode connected to the surface field region, wherein at least one of the emitter region and the surface field region is made of amorphous metal silicide containing a metal material.

8 Claims, 19 Drawing Sheets

(56) References Cited

U.S. PATENT DOCUMENTS

2011/0303548 A1* 12/2011 Demuth et al. ............... 205/340
2011/0318872 A1* 12/2011 Becker et al. .................. 438/98

FOREIGN PATENT DOCUMENTS

| | | |
|---|---|---|
| KR | 10-2005-0045047 A | 5/2005 |
| KR | 10-2010-0096819 A | 9/2010 |
| WO | WO 97/13280 A1 | 4/1997 |
| WO | WO 2009/114446 A2 | 9/2009 |
| WO | WO 2010043208 A1 * | 4/2010 |
| WO | WO 2010088898 A2 * | 8/2010 |

* cited by examiner

SOLAR CELL AND METHOD FOR MANUFACTURING THE SAME

CROSS-REFERENCE TO RELATED APPLICATION

This application claims priority to and the benefit of Korean Patent Application No. 10-2010-0082606, filed in the Korean Intellectual Property Office on Aug. 25, 2010, the entire contents of which are incorporated herein by reference.

BACKGROUND OF THE INVENTION (a) Field of the Invention

Embodiments of the invention relate to a solar cell and a method for manufacturing the solar cell.

(b) Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts that have different conductivity types, such as a p-type and an n-type, and form a p-n junction, and electrodes respectively connected to the semiconductor parts of the different conductivity types.

When light is incident on the solar cell, electron-hole pairs are generated in the semiconductor parts. The electrons move to the n-type semiconductor part and the holes move to the p-type semiconductor part, and then the electrons and holes are collected by the electrodes connected to the n-type semiconductor part and the p-type semiconductor part, respectively. The electrodes are connected to each other using electric wires to thereby obtain electric power.

SUMMARY OF THE INVENTION

In one aspect, there is a solar cell including a substrate containing a first impurity of a first conductivity type and made of a crystalline semiconductor, an emitter region positioned on the substrate and containing a second impurity of a second conductivity type different from the first conductivity type, the emitter region being made of a non-crystalline semiconductor, a surface field region positioned on the substrate and containing a third impurity of the first conductivity type, the surface field region being made of the non-crystalline semiconductor, a first electrode connected to the emitter region, and a second electrode connected to the surface field region, wherein at least one of the emitter region and the surface field region is made of amorphous metal silicide containing a metal material.

The at least one of the emitter region and the surface field region may have a resistance of $1\times10^{-6}$ to $1\times10^{-3}$ Ω-cm.

A concentration of the metal material contained in the at least one of the emitter region and the surface field region may be $1\times10^{15}$ atoms/cm$^2$ to $1\times10^{21}$ atoms/cm$^2$.

The at least one of the emitter region and the surface field region may include a first portion contacting the substrate and made of amorphous silicon and a second portion positioned on the first portion and made of the amorphous metal silicide, and wherein the first and second regions are doped with the second impurity or the third impurity.

The first portion may have an impurity doped concentration of the second impurity or the third impurity equal to an impurity doped concentration of the second portion of the second impurity or the third impurity.

The impurity doped concentration of the first and second portions may be $1\times10^{16}$ atoms/cm$^3$ to $1\times10^{21}$ atoms/cm$^3$, respectively.

An impurity doped concentration of the second impurity or the third impurity contained in the at least one of the emitter region and the surface field region may be changed in accordance with a change in a thickness of the at least one of the emitter region and the surface field region.

The impurity doped concentration of the second impurity or the third impurity contained in the at least one of the emitter region and the surface field region may increase from a contact surface of the substrate and the emitter region to an opposite surface of the emitter region or the substrate and the surface field region to an opposite surface of the surface field region.

The impurity doped concentration of the second impurity or the third impurity contained in the at least one of the emitter region and the surface field region may increase from $1\times10^{16}$ atoms/cm$^3$ to $1\times10^{21}$ atoms/cm$^3$.

The impurity doped concentration of the second impurity or the third impurity contained in the at least one of the emitter region and the surface field region may increase from 0 atoms/cm$^3$ to $1\times10^{21}$ atoms/cm$^3$.

The at least one of the emitter region and the surface field region may include a first portion contacting the substrate and made of amorphous metal silicide and a second portion positioned on the first portion and made of the amorphous metal silicide, and wherein an impurity doped concentration of the second or third impurity in the first portion is less than an impurity doped concentration of the second or third impurity in the second portion.

The impurity doped concentration of the first portion may be $1\times10^{10}$ to $1\times10^{15}$ atoms/cm$^3$, and the impurity doped concentration of the second portion is $1\times10^{16}$ to $1\times10^{21}$ atoms/cm$^3$.

The impurity doped concentration of the first portion may be 0 atoms/cm$^3$, and the impurity doped concentration of the second portion may be $1\times10^{16}$ to $10^{21}$ atoms/cm$^3$.

The metal material may include at least one of chromium (Cr), aluminum (Al), cobalt (Co), hafnium (Hf), molybdenum (Mo), nickel (Ni), lead (Pd), platinum (Pt), tantalum (Ta), titanium (Ti), tungsten (W), and zirconium (Zr).

The first impurity may be the same the third impurity.

The first impurity may be different from the third impurity.

The emitter region may be positioned on an incident surface of the substrate, on which light is incident.

The surface field region may be positioned on a surface of the substrate, which is opposite the incident surface of the substrate.

The emitter region may be positioned on a surface of the substrate, which is opposite an incident surface of the substrate.

The emitter region and the surface field region may be positioned on the same surface of the substrate.

In another aspect, there is a method for manufacturing a solar cell including forming an amorphous silicon layer containing an impurity on a silicon substrate, forming a metal layer containing a metal material on the amorphous silicon layer, performing a thermal process on the metal layer and the amorphous silicon layer and changing at least one portion of the amorphous silicon layer into amorphous metal silicide, to form an amorphous metal silicide region, removing a remaining portion of the metal layer, and forming an electrode connected to the amorphous metal silicide region.

The metal layer may have a thickness of substantially 1 nm to 100 nm.

The metal layer may have a thickness of substantially 0.5 nm to 2 nm.

An impurity doped concentration of the impurity in the amorphous silicon layer may be $1\times10^{16}$ to $1\times10^{21}$ atoms/cm$^3$.

An impurity doped concentration of the impurity into the amorphous silicon layer may be linearly or nonlinearly changed from $1\times10^{10}$ to $1\times10^{21}$ atoms/cm$^3$ in accordance with a change in a thickness of the amorphous silicon layer.

An impurity doped concentration of the impurity into the amorphous silicon layer may be linearly or nonlinearly changed from 0 atoms/cm$^3$ to $1\times10^{21}$ atoms/cm$^3$ in accordance with a change in a thickness of the amorphous silicon layer.

The metal material may include at least one of chromium (Cr), aluminum (Al), cobalt (Co), hafnium (Hf), molybdenum (Mo), nickel (Ni), lead (Pd), platinum (Pt), tantalum (Ta), titanium (Ti), tungsten (W), and zirconium (Zr).

A concentration of the material contained in the metal layer may be $1\times10^{15}$ atoms/cm$^2$ to $1\times10^{21}$ atoms/cm$^2$.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
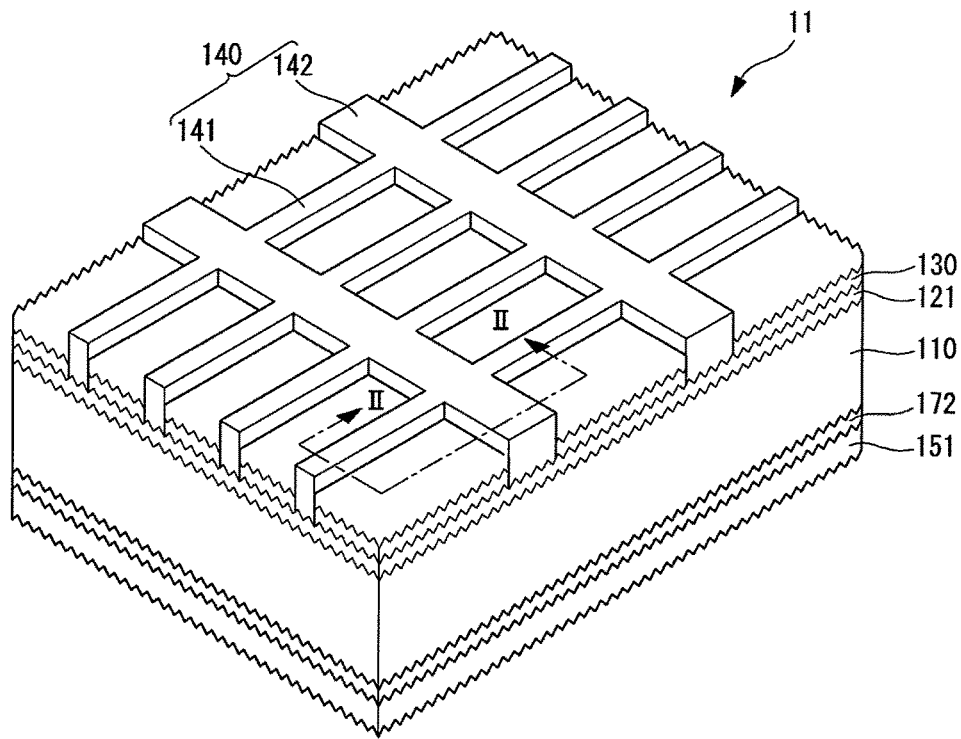
FIG. 1 is a partial sectional view of a solar cell according to an example embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 2:
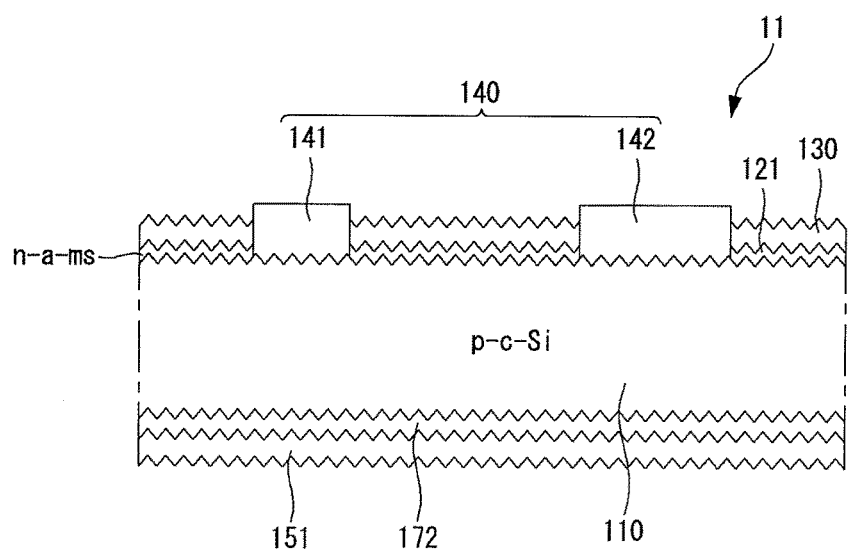
FIGS. 2 to 8 are partial sectional views of various solar cells according to example embodiments of the invention, respectively.

As shown in FIGS. 1 and 2, a solar cell 11 according to an example embodiment of the invention includes a substrate 110, an emitter region 121 positioned on an incident surface (hereinafter, referred to as "a front surface") of the substrate 110 on which light is incident, an anti-reflection layer 130 positioned on the emitter region 121, a back surface field (BSF) region 172 positioned on a surface (hereinafter, referred to as "a back surface") of the substrate 110 opposite the front surface of the substrate 110, a front electrode unit 140 connected to the emitter region 121 and a back electrode 151 positioned on the BSF region 172.

The substrate 110 is a semiconductor substrate formed of, for example, first conductivity type silicon, for example, p-type silicon (p-c-Si), though not required. Silicon used in the substrate 110 may be crystalline silicon such as single crystal silicon and polycrystalline silicon, and thereby, the substrate 110 is made of crystalline semiconductor. When the substrate 110 is of a p-type, the substrate 110 is doped with impurities of a group III element such as boron (B), gallium (Ga), and indium (In).

Alternatively, the substrate 110 may be of an n-type, and/or be formed of semiconductor materials other than silicon. When the substrate 110 is of the n-type, the substrate 110 is doped with impurities of a group V element such as phosphor (P), arsenic (As), and antimony (Sb).

The front and back surfaces of the substrate 110 are textured to form a textured surface corresponding to an uneven surface or having uneven characteristics. The textured surface may be formed by an etching process to remove a saw damage on at a substantially planar surface of the substrate 110, a texturing process performed on the substantially planar surface of the substrate 110, or a surface of substrate 110 on which the etching process to remove the saw damage has been performed. For example, when the substrate 110 is made of polycrystalline silicon, the textured surface of the substrate 110 may be formed by the saw damage etching process, and when the substrate 110 is made of single crystal silicon, the textured surface of the substrate 110 may be formed by the texturing process.

For convenience, FIG. 1 shows only an edge portion of the substrate 110 as having the textured surface and only edge portions of the emitter region 121 and the anti-reflection layer 130 on the front surface of the substrate 110 as having the textured surface. However, in actuality, the entire front surface and the entire back surface of the substrate 110 may have the textured surface, and thus the emitter region 121 and the anti-reflection layer 130 on the front surface of the substrate 110, and the BSF region 172 and the back electrode 151 of the back surface of the substrate 110 may have the textured surface.

In alternative example, only the front surface of the substrate 110 may be a textured surface. In this instance, only the emitter region 121 and the anti-reflection layer 130 have the textured surface.

The emitter region 121 substantially positioned on the entire front surface of the substrate 110 is of a second conductivity type (for example, an n-type) opposite a conductivity type of the substrate 110 and is made of a different semiconductor from the substrate 110, for example, amorphous metal silicide (n-a-ms) containing a metal material. Thus, the emitter region 121 is made of amorphous silicon (that is, amorphous semiconductor) containing the metal material, and thereby, the emitter region 121 and the substrate 110 form a hetero junction as well as a p-n junction.

By a built-in potential difference resulting from the p-n junction between the substrate 110 and the emitter region 121, a plurality of electrons and a plurality of holes produced by light incident on the substrate 110 move to the n-type semiconductor and the p-type semiconductor, respectively. Thus, when the substrate 110 is of the p-type and the emitter region 121 is of the n-type, the electrons move to the emitter region 121 and the holes move to the back surface of the substrate 110

Because the substrate 110 and the emitter region 121 form the p-n junction, the emitter region 121 may be of the p-type when the substrate 110 is of the n-type unlike the embodiment described above. In this instance, the electrons move to the back surface of the substrate 110, and the holes move to the emitter region 121.

When the emitter region 121 is of the n-type, the emitter region 121 may be doped with impurities of a group V element. On the contrary, when the emitter region 121 is of the p-type, the emitter region 121 may be doped with impurities of a group III element. The emitter region 121 may have a thickness of substantially 10 nm to 30 nm.

When the thickness of the emitter region 121 is equal to or greater than approximately 10 nm, the emitter region 121 may form a good p-n junction to perform a stable functioning emitter region 121. When the thickness of the emitter region 121 is equal to or less than approximately 30 nm, an amount of light absorbed in the emitter region 121 is further reduced. Hence, an amount of light again incident inside the substrate 110 may further increase.

The anti-reflection layer 130 connected to the emitter region 121 reduces a reflectance of light incident on the solar cell 11 and increases selectivity of a predetermined wavelength band of the light, thereby increasing the efficiency of the solar cell 1. The anti-reflection layer 130 may be formed of hydrogenated silicon oxide (SiOx:H) and/or hydrogenated silicon nitride (SiNx:H). In this embodiment, the anti-reflection layer 130 has a single-layered structure, but the anti-reflection layer 130 may have a multi-layered structure such as a double-layered structure in other embodiments. The anti-reflection layer 130 may be omitted, if desired.

The front electrode unit 140 includes a plurality of front electrodes 141 and a plurality of front bus bars 142. The plurality of front electrodes 141 are electrically and physically connected to the emitter region 121 and extend substantially parallel to one another in a fixed direction. The front electrodes 141 collect carriers (e.g., electrons) moving to the emitter region 120.

The plurality of front bus bars 142 are positioned on the emitter region 121 and extend substantially parallel to one another in a direction crossing an extending direction of the front electrodes 141. The front bus bars 142 are electrically and physically connected to the emitter region 120 and the front electrodes 141.

The front electrodes 141 and the front bus bars 142 are placed on the same level layer (i.e., coplanar). The front bus bar 142 is electrically and physically connected to the corresponding front electrode 141 at crossings of the front electrodes 141 and the front bus bars 142.

As shown in FIG. 1, each of the plurality of front electrodes 141 has a stripe shape extending in a transverse or longitudinal direction and each of the plurality of front bus bars 142 has a stripe shape extending in a longitudinal or traverse direction. Thus, the front electrode part 140 has a lattice shape on the front surface of the substrate 110.

Each front bus bar 142 collects carriers (for example, electrons) collected through the front electrodes 141 as well as carriers moving from the emitter region 121 and output the carriers to an external device. Because the plurality of front bus bars 142 collect the carriers collected by the plurality of front electrodes 141 and move the carriers to a desired location, a width of each of the plurality of front bus bars 142 is greater than a width of each of the plurality of front electrodes 141. The plurality of front bus bars 142 are connected to an external device to output the carrier (for example, electrons) to the external device.

The front electrode unit 140 of the plurality of front electrodes 141 and the plurality of front bus bars 142 contain at least one conductive material such as silver (Ag). Alternatively, the front electrode unit 140 may contain at least one selected from the group consisting of nickel (Ni), copper (Cu), aluminum (Al), tin (Sn), zinc (Zn), indium (In), titanium (Ti), gold (Au), and a combination thereof. Other conductive materials may be used.

Although FIG. 1 shows a predetermined number of front electrodes 141 and a predetermined number of front bus bars 142 on the substrate 110, the number of front electrodes 141 and the number of front bus bars 142 may vary.

In a comparative example, the emitter region is made of amorphous silicon. In this instance, the resistivity of the emitter region is approximately $10^6$ Ω-cm or more when the emitter region is of a p-type, and the resistivity of the emitter region is approximately $10^2$ Ω-cm or more when the emitter region is of an n-type. Thereby, since the resistivity of the emitter region of the comparative example is mostly larger than that of crystalline silicon (having a resistivity of 1 Ω-cm to 10 Ω-cm), the emitter region of the comparative example has a low conductivity due to the high resistivity. Thereby, since it is hard for charges existing at the emitter region to move to the front electrodes 141 or the front bus bars 142 along the emitter region of the high resistivity, a serial resistivity of a solar cell according to the comparative example increases. Accordingly, a charge transfer amount from the emitter region to the front electrode unit 140 reduces and a charge transfer efficiency of the solar cell of the comparative example decreases.

In addition, contact resistance between the emitter region of amorphous silicon and the front electrode unit 140 of a metal material increases, and thereby a contact between the emitter region of amorphous silicon and the front electrode unit 140 becomes poor. For improving the charge transfer amount and the charge transfer efficiency between the emitter region of amorphous silicon and the front electrode unit 140, the comparative example further includes a separate layer of a low resistivity, which is made of transparent conductive oxide (TCO) such as indium tin oxide (ITO), etc. In this instance, since light incident on the substrate is absorbed into the TCO layer, an amount of light reaching the substrate is reduced to decrease short current of the solar cell. Thereby, the efficiency of the solar cell of the comparative example is reduced.

However, in the example according to the embodiment of the invention, since the emitter region 121 is made of amorphous metal silicide containing the metal material, the emitter region 121 has a resistivity lower than that of the emitter of amorphous silicon, and thereby the conductivity of the emitter region 121 is improved. Further, since the emitter region 121 contains the metal material such silver (Ag), contact resistance with the front electrode unit 140 is reduced. Thus, an amount of charges (for example, electrons) transferred from the substrate 110 to the front electrode unit 140 increases and a transfer efficiency of the charges is improved.

In the example embodiment, as resistance of the emitter region 121 is about $1 \times 10^{-6}$ Ω-cm to $1 \times 10^{-3}$ Ω-cm, the resistance of the emitter region 121 is largely reduced as compared to resistance of amorphous silicon of the comparative example. A content (that is, a metal content) of the metal material of the emitter region 121, which are contained into the emitter region 121 for the resistance thereof may be $1 \times 10^{15}$ atoms/cm$^2$ to $1 \times 10^{21}$ atoms/cm$^2$.

The emitter region 121 of the amorphous metal silicide contains at least one of chromium (Cr), aluminum (Al), cobalt (Co), hafnium (Hf), molybdenum (Mo), nickel (Ni), palladium (Pd), platinum (Pt), tantalum (Ta), titanium (Ti), tungsten (W), and zirconium (Zr), to improve the conductivity of the emitter region 121.

When the resistance of the emitter region 121 is about $1 \times 10^{-3}$ Ω-cm or less, the emitter region 121 has a good conductivity to more easily transfer the charges from the emitter region 121 to the front electrode unit 140, and thereby the charge transfer efficiency of the solar cell 11 is improved.

When the metal content of the emitter region 121 is about $1 \times 10^{15}$ atoms/cm$^2$ or more, the emitter region 121 has the resistance of a about $1 \times 10^{-3}$ Ω-cm or less, and when the metal content of the emitter region 121 is about $1 \times 10^{21}$ atoms/cm$^2$ or less, waste of the metal material for the emitter region 121 is prevented to further reduce a manufacturing cost of the solar cell 11 as having the desired conductivity (or resistance).

In addition, since a separate TCO layer is omitted, a light absorption into the TCO layer does not occur, the efficiency of the solar cell 11 is further improved and the manufacturing time and cost of the solar cell 11 are reduced, and a thickness of the solar cell 11 decreases.

The BSF region 172 is an impurity region that is more heavily doped with impurities of the same conductivity type as the substrate 110 than the substrate 110. For example, The BSF region 172 may be an n$^+$-type region. The BSF region 172 is made of a different semiconductor material from the substrate 110, for example, non-crystalline semiconductor such as amorphous silicon (a-Si) or an amorphous metal silicide containing a metal material. Thereby, the BSF region 172 forms a hetero junction with the substrate 110, like the emitter region 121.

The BSF region 172 prevents or reduces the movement of electrons to the BSF region 172 used as a moving path of holes, but facilitates the movement of holes to the BSF region 172 by a potential barrier resulting from a difference between impurity concentrations of the substrate 110 and the BSF regions 172. Thus, the BSF region 172 reduces a loss amount of carriers by a recombination and/or a disappearance of electrons and holes in or around the back surface of the substrate 110, and accelerates the movement of desired charges (e.g., holes) to the BSF region 172, thereby increasing an amount of charges moving to the back electrode 151.

Since the BSF region 172 has the same conductivity type as the substrate 110, when the substrate 110 is of a p-type, the BSF region 172 is doped with impurities of a group III element, and when the substrate 110 is of an n-type, the BSF region 172 is doped with impurities of a group V element. In this instance, since the BSF region 172 may be doped with the same impurities as or different impurities from the substrate 110, the impurity doped into the BSF region 172 may be equal to or different from the impurity doped into the substrate 110.

In this embodiment, the thickness of the BSF region 172 may be approximately 10 nm to 30 nm. When the thickness of the BSF region 172 is equal to or greater than approximately 10 nm, the BSF region 172 may stably form a potential barrier to normally perform the back surface field function. When the thickness of the BSF region 172 is equal to or less than approximately 30 nm, the BSF region 172 further reduces an amount of light absorbed in the BSF region 172 to thereby increase an amount of light again incident inside the substrate 110 .

The back electrode 151 is connected to the BSF region 172 which is positioned on the back surface of the substrate 110 and may be positioned on substantially the entire back surface of the substrate 110 except an edge of the back surface of the substrate 110. The BSF region 172 may be positioned on the entire back surface of the back surface of the substrate 110 including the edge of the back surface of the substrate 110 in another embodiment.

The back electrode 151 contains a conductive material such as aluminum (Al). The back electrode 151 may contain a different conductive material from the front electrode unit 140. The back electrode 151 collects carriers (for example, holes) moving to the back surface field layer 172.

Because the back electrode 151 contacts the BSF region 172 having the impurity concentration higher than the substrate 110, a contact resistance between the substrate 110 (i.e., the BSF region 172) and the back electrode 151 decreases. Hence, the charge (i.e., the carrier) transfer efficiency from the substrate 110 to the back electrode 151 is improved.

In an alternative example embodiment, the back electrode 151 is formed of another conductive material instead of aluminum (Al). For example, the another conductive material may be at least one selected from the group consisting of nickel (Ni), copper (Cu), silver (Ag), tin (Sn), zinc (Zn), indium (In), titanium (Ti), gold (Au), and a combination thereof.

The back electrode 151 is connected to an external device and outputs the carriers (for example, holes) collected by the back electrode 151 to the external device. In an alternative example embodiment, the solar cell 11 may further include a plurality of back bus bars connected to the back electrode 151.

The plurality of back bus bars may be positioned on the back surface of the substrate 110 and be connected to the back electrode 151. Further, the plurality of back bus bars may be positioned opposite the plurality of front bus bars 142 with the substrate 110 therebetween. The plurality of back bus bars may be directly positioned on the back surface of the substrate 110, and in this instance, the back electrode 151 may be not positioned on portions on which the plurality of back bus bars are positioned. Further, the plurality of back bus bars may be positioned on the back electrode 151, and in this instance, the back electrode 151 may be positioned on substantially the entire surface of the back surface of the substrate 110.

The plurality of back bus bars collect carriers from the back electrode 151 in the same manner as the plurality of front bus bars 142. The plurality of back bus bars are connected to the external device and output the carriers (for example, holes) collected by the back bus bars to the external device.

The plurality of back bus bars may be formed of a material having better conductivity than the material of the back electrode 151. Further, the plurality of back bus bars may contain at least one conductive material having a good conductivity, for example, silver (Ag).

In a similar manner as the emitter region 121, since the BSF region 172 is made of amorphous metal silicide containing the metal material, the BSF region 172 has a resistivity lower than that of a BSF region made of amorphous silicon, and thereby the conductivity of the BSF region 172 is improved. Further, a contact resistance with the back electrode 151 containing a metal material such as aluminum (Al) is reduced. Thus, an amount of charges (for example, holes) transferred from the BSF region 172 to the back electrode 151 increases, and thereby the efficiency of the solar cell 11 increases.

Like the emitter region 121, the resistance of the BSF region 172 made of the amorphous metal silicide (that is, amorphous silicon metal compound) may be approximately $1\times10^{-6}$ Ω-cm to $1\times10^{-3}$ Ω-cm and a metal content of the BSF region 172 may be approximately $1\times10^{15}$ atoms/cm$^2$ to $1\times10^{21}$ atoms/cm$^2$.

The BSF region 172 of the amorphous metal silicide contains at least one of chromium (Cr), aluminum (Al), cobalt (Co), hafnium (Hf), molybdenum (Mo), nickel (Ni), lead (Pd), platinum (Pt), tantalum (Ta), titanium (Ti), tungsten (W), and zirconium (Zr), to improve the conductivity of the BSF region 172.

When the resistance of the BSF region 172 is approximately $1\times10^{-3}$ Ω-cm or less, the BSF region 172 has a good conductivity to more easily transfer the charges from the BSF region 172 to the back electrode 151, and thereby the charge transfer efficiency of the solar cell 11 is improved.

When the metal content of the BSF region 172 is approximately $1\times10^{15}$ atoms/cm$^2$ or more, the BSF region 172 has the resistance of approximately $1\times10^{-3}$ Ω-cm or less, and when the metal content of the BSF region 172 is about $1\times10^{21}$ atoms/cm$^2$ or less, the BSF region 172 has a desired conductivity (or resistance) and further prevents waste of the metal material for the BSF region 172 to further reduce a manufacturing cost of the solar cell 11.

An operation of the solar cell 11 having the above-described structure is described below. When light irradiated to the solar cell 11 is incident on the emitter region 121 and the substrate 110 through the anti-reflection layer 130, a plurality of electron-hole pairs are generated in the semiconductor portions such as the emitter layer 121 and the substrate 110 by light energy based on the incident light. In this instance, because a reflection loss of the light incident on the substrate 110 is reduced by the textured surface of the substrate 110 and the anti-reflection layer 130, an amount of light incident on the substrate 110 further increases.

By the p-n junction of the substrate 110 and the emitter region 121, the electrons and holes move to the semiconductor portion of an n-type and the semiconductor portion of a p-type, respectively. For example, the electrons move to the emitter region 121 of the n-type and the holes move to the back surface of the substrate 110 of the p-type. The electrons moving to the n-type emitter region 121 are collected to the plurality of front electrodes 141 and then move to the front bus bars 142. The holes moving to the back surface of the p-type substrate 110 are collected by the back electrode 151 through the BSF region 172. When the front bus bars 142 are connected to the back electrode 151 using electric wires, current flows therein to thereby enable use of the current for electric power.

In the example embodiment, since the emitter region 121 is made of amorphous metal silicide, the conductivity of the emitter region 121 increases, while the contact resistance between the emitter region 121 and the front electrode unit 140 decreases. In the same manner as the emitter region 121, since the BSF region 172 is also made of amorphous metal silicide, the conductivity of the BSF region 172 increases and the contact resistance between the BSF region 172 and the back electrode 151 decreases. Thus, the serial resistance of the solar cell 11 decreases, and thereby an amount of charges transferred from the emitter region 121 to the front electrode unit 140 and an amount of charges transferred from the BSF region 172 to the back electrode 151 increase. Accordingly, a transfer efficiency of the charges is improved and an efficiency of the solar cell 11 is improved.

Next, referring to FIGS. 3 to 8, various examples according to the embodiment of the invention are described. As compared with FIGS. 1 and 2, the elements performing the same operations are indicated with the same reference numerals, and a detailed description thereof is omitted.

Figure 3:
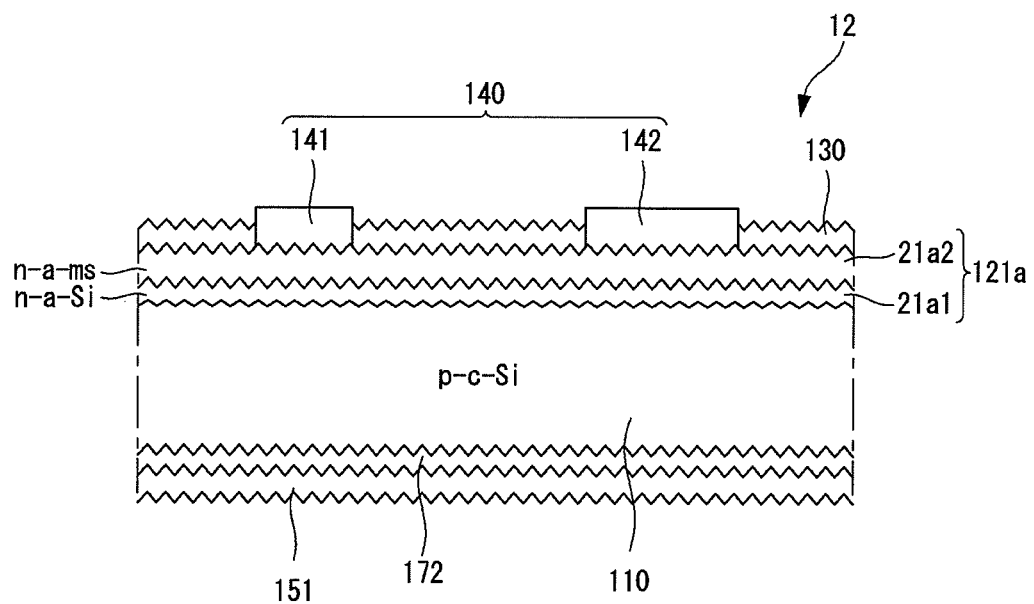
Figure 4:
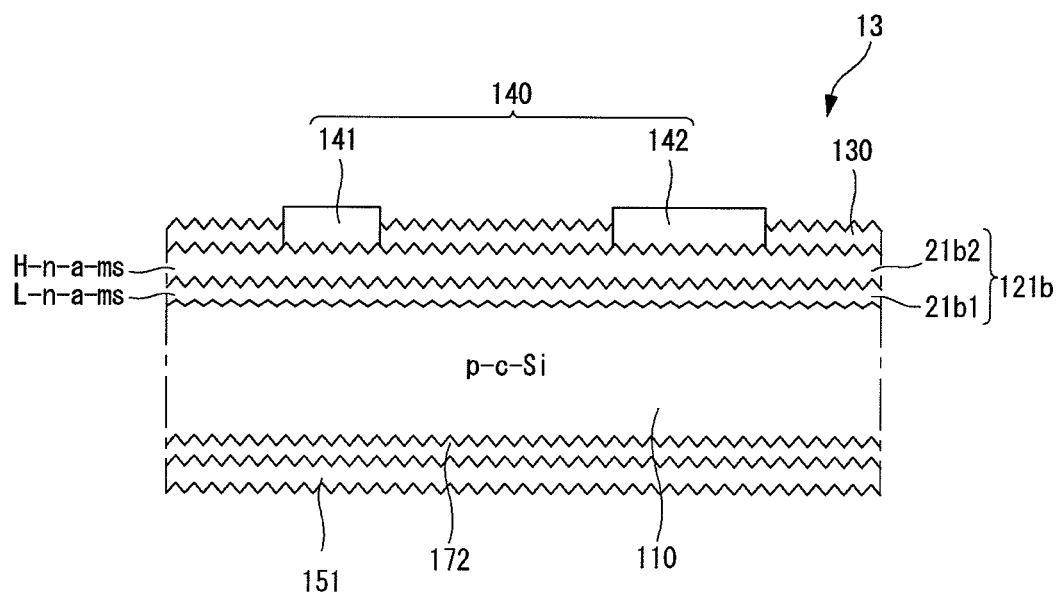
Figure 5:
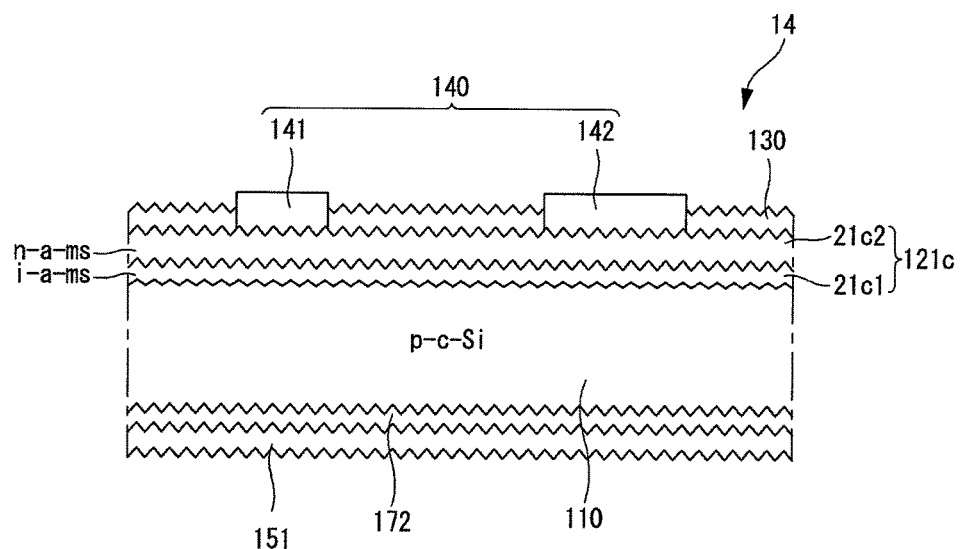

The solar cells 12 to 14 shown in FIGS. 3 to 5 have the same structure as the solar cell 11 of FIGS. 1 and 2, except structures of the emitter regions 121a-121c.

That is, each of the solar cells 12-14 include an emitter region 121a-121c, respectively, an anti-reflection layer 130 on the respective emitter region 121a-121c, a front electrode unit 140 connected to each emitter region 121a-121c and having a plurality of front electrodes 141 and a plurality of front bus bars 142, a BSF region 172 on a back surface of the substrate 110, and a back electrode 151 on the BSF region 172. The substrate 110 is made of a crystalline semiconductor, and the emitter region 121a-121c and the BSF region 172 are made of a non-crystalline semiconductor.

However, in the solar cell 12 in FIG. 3, the emitter region 121a that contains impurities of a conductivity type (for example, an n-type) opposite the substrate 110 includes two portions 21a1 and 21a2 having different metal contents from each other in accordance with a thickness variation of the portions 21a1 and 21a2.

That is, the emitter region 121a includes a first portion 21a1 and a second portion 21a2. The first portion 21a1 (an n-type amorphous silicon portion, n-a-Si) is made of amorphous silicon not containing a metal material or hardly containing the metal material, that is, substantially not containing the metal material, and the second portion 21a2 (an n-type amorphous metal silicide portion, n-a-ms) is made of amorphous metal silicide and thereby contains a metal material. For example, the metal material is not intentionally included in the first portion 21a1 but is intentionally included in the second portion 21a2.

In the example embodiment, however, the first and second portions 21a1 and 21a2 of the emitter region 121a may have the same impurity doped concentrations as one another, and thereby, the impurity doped concentrations of the first and second portions 21a1 and 21a2 in a unit volume are equal to each other. In this instance, the impurity doped concentrations of the first and second portions 21a1 and 21a2 of the emitter region 121*a* may be one within a range of approximately $1\times10^{16}$ to $1\times10^{21}$ atoms/cm³, respectively.

The first portion 21*a*1 is in contact with the substrate 110 to form a lower surface of the emitter region 121*a*, and the second portion 21*a*2 is positioned on the first portion 21*a*1 and in contact with the anti-reflection layer 130 to form an upper surface of the emitter region 121*a*. Thus, in the same front surface position of the substrate 110, the minimum distance from the same front surface position to the first portion 21*a*1 is shorter than that to the second portion 21*a*2.

In the example embodiment, the first portion 21*a*1 of the emitter region 121*a* may have a thickness of approximately 2 nm to 10 nm, and the second portion 21*a*2 of the emitter region 121*a* may have a thickness of approximately 5 nm to 20 nm.

When the thickness of the first portion 21*a*1 is approximately 2 nm or more, the first portion 21*a*1 more uniformly applied on the front surface of the substrate 110 and thereby stably performs the passivation function, and when the thickness of the first portion 21*a*1 is approximately 10 nm or less, a light absorption amount into the first portion 21*a*1 is further reduced to further increase an amount of light that is incident on the substrate 110.

When the thickness of the second portion 21*a*2 is approximately 5 nm or more, the second portion 21*a*2 more easily obtains the conductivity of a desired magnitude due to the resistance reduction, and when the thickness of the second portion 21*a*2 is approximately 20 nm or less, the second portion 21*a*2 stably obtains the emitter efficiency and the conductivity without unnecessary thickness increment of the emitter region 121*a*.

In the solar cell 13 of the FIG. 4, the emitter region 121*b* that contains impurities of a conductivity type (for example, an n-type) impurity opposite the substrate 110 includes two portions 21*b*1 and 21*b*2 having different metal contents from each other in accordance with a thickness variation of the emitter region 121*b*.

That is, the first and second portions 21*b*1 and 21*b*2 of the emitter region 121*b* are made of amorphous metal silicide, but the first and second portion 21*b*1 (L-n-a-ms) and 21*b*2 (H-n-a-ms) have different impurity doped concentrations of the conductivity type (e.g., an n-type) from each other.

The first portion 21*b*1 contacts the substrate 110 and the second portion 21*b*2 is positioned on the first portion 21*b*1 to contact the anti-reflection layer 130. Thereby, in the same front surface position of the substrate 110, the minimum distance from the same front surface position to the first portion 21*b*1 is shorter than that to the second portion 21*b*2.

At the instance, the impurity doped concentration of the first portion 21*b*1 is less than that of the second portion 21*b*2.

For example embodiment, the impurity doped concentration of the first portion 21*b*1 may be one within a range of approximately $1\times10^{10}$ to $1\times10^{15}$ atoms/cm³, and the impurity doped concentration of the second portion 21*b*2 may be one within a range of approximately $1\times10^{16}$ to $1\times10^{21}$ atoms/cm³. However, in an alternative example embodiment, the emitter region 121*b* may have an impurity doped concentration linearly or nonlinearly changing from $1\times10^{10}$ atoms/cm³ to $1\times10^{21}$ atoms/cm³ from the substrate 110 to the anti-reflection layer 130, that is in accordance with a change in a thickness of the emitter region 121*b*.

A portion of the minimum impurity doped concentration (approximately $1\times10^{10}$ atoms/cm³) is a portion (a lower surface) of the first portion 21*b*1 contacting with the substrate 110 and a portion of the maximum impurity doped concentration (approximately $1\times10^{21}$ atoms/cm³) is a portion (an upper surface or an opposite surface) of the second portion 21*b*2 contacting with the anti-reflection layer 130.

The first portion 21*b*1 may have a thickness of approximately 5 nm to 10 nm and the second portion 21*b*2 may have a thickness of approximately 5 nm to 20 nm.

When the thickness of the first portion 21*b*1 is approximately 5 nm or more, the first portion 21*b*1 stably performs the passivation function in spite of the existence of the impurity causing the defects to increase the conductivity of the first portion 21*b*1, and when the thickness of the first portion 21*b*1 is approximately 10 nm or less, an amount of light absorbed into the first portion 21*c*1 is further reduced to further increase an amount of light incident on the substrate 110.

When the thickness of the second portion 21*b*2 is approximately 5 nm or more, the second portion 21*b*2 more easily obtains the conductivity of a desired magnitude due to the resistance reduction, and when the thickness of the second portion 21*b*2 is approximately 20 nm or less, the second portion 21*b*2 stably obtains the emitter efficiency and the conductivity without unnecessary thickness increment of the emitter region 121*b*.

Similar to FIG. 4, the solar cell 14 shown in FIG. 5 includes the emitter region 121*c* having first and second portions 21*c*1 and 21*c*2. The first and second portions 21*c*1 and 21*c*2 are made of amorphous metal silicon and have different metal contents from each other in accordance with a thickness variation of the emitter region 121*c*.

However, unlike the FIG. 4, the emitter region 121*c* of FIG. 5 includes the first portion 21*c*1 made of intrinsic amorphous metal silicide (i-a-ms) in which impurities (e.g., an n-type) opposite that of the substrate 110 are not contained or are hardly contained, that is, the impurities are not substantially contained, and a second portion 21*c*2 made of an n-type amorphous metal silicide (n-a-ms) in which the impurities of the conductivity type are contained. Thereby, the second portion 21*c*2 contains the impurities of a desired conductivity type such as the n-type.

As described above, the first portion 21*c*1 contacts the substrate 110 and the second portion 21*c*2 is positioned on the first portion 21*b*1 and thereby contacts the anti-reflection layer 130. Thus, in the same front surface position of the substrate 110, the minimum distance from the same front surface position to the first portion 21*c*1 is shorter than that to the second portion 21*c*2.

For example, the second portion 21*c*1 may have an impurity doped concentration of one within a range of approximately $1\times10^{16}$ to $1\times10^{21}$ atoms/cm³ or may have an impurity doped concentration linearly or nonlinearly changing from $1\times10^{16}$ atoms/cm³ to $1\times10^{21}$ atoms/cm³ in accordance with a change in a thickness of the emitter portion 21*c*.

A portion of the minimum impurity doped concentration (approximately $1\times10^{15}$ atoms/cm³) is a portion (a lower surface) of the first portion 21*c*2 contacting with the first portion 21*c*1, and a portion of the maximum impurity doped concentration (approximately $1\times10^{21}$ atoms/cm³) is a portion (an upper surface or an opposite surface) of the second portion 21*c*2 contacting with the anti-reflection layer 130.

The first portion 21*c*1 may have a thickness of approximately 2 nm to 10 nm and the second portion 21*c*2 may have a thickness of approximately 5 nm to 20 nm.

When the thickness of the first portion 21*c*1 is approximately 2 nm or more, the first portion 21*c*1 more uniformly applied on the front surface of the substrate 110 and thereby stably performs the passivation function, and when the thickness of the first portion 21*c*1 is approximately 10 nm or less, an amount of light absorbed into the first portion 21*c*1 is further reduced to further increase an amount of light that is incident on the substrate 110.

When the thickness of the second portion 21c2 is approximately 5 nm or more, the second portion 21c2 more easily obtains the conductivity of a desired magnitude due to the resistance reduction, and when the thickness of the second portion 21c2 is approximately 20 nm or less, the second portion 21c2 stably obtains the emitter efficiency and the conductivity without unnecessary thickness increment of the emitter region 121c.

Like the solar cell 11 of FIGS. 1 and 2, in the solar cells 12-14 in FIGS. 3-5, since portions (that is, the second portions 21a2, 21b2, and 21c2) contacting the front electrode unit 140 are made of amorphous metal silicide of a large conductivity and a low resistance, an amount of charges transferred from the substrate 110 to the front electrode unit 140 increases to improve a transfer efficiency of the charges, and a separate TCO layer is not inserted between the emitter region 121a-121c and the front electrode unit 140.

In addition, as compared with the solar cell 11 in FIGS. 1 and 2, since the first portions 21a1, 21b1, and 21c1 of the emitter portions 121a-121c of the solar cells 12-14 of FIGS. 3 to 5, which are directly in contact with the surface of the substrate 110, respectively are made of amorphous silicon, amorphous metal silicide of a low metal content or intrinsic amorphous silicon, the first portions 21a1, 21b1, and 21c1 of the emitter portions 121a-121c perform the passivation function to reduce a loss amount of the charges that disappear on and near the surface of the substrate 110. Thereby, an efficiency of each solar cell 12-14 is improved.

Figure 6:
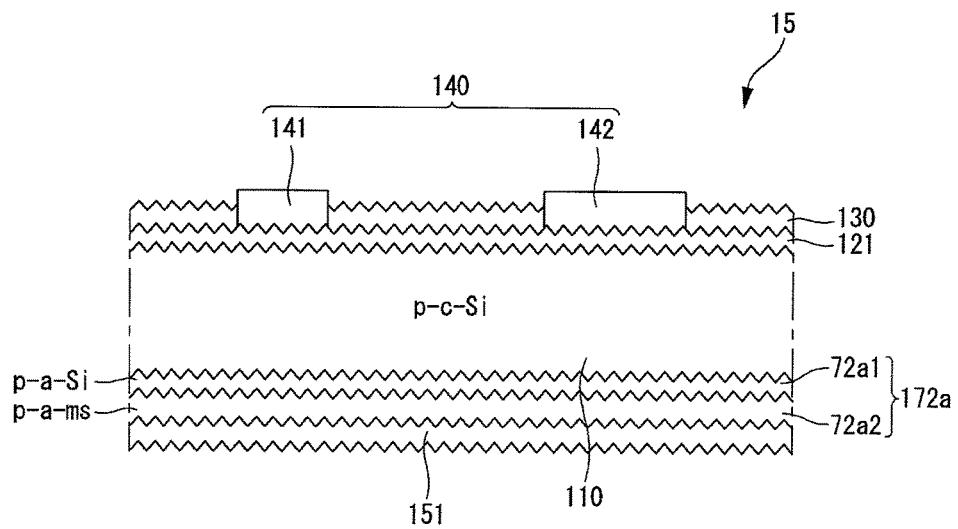
Figure 7:
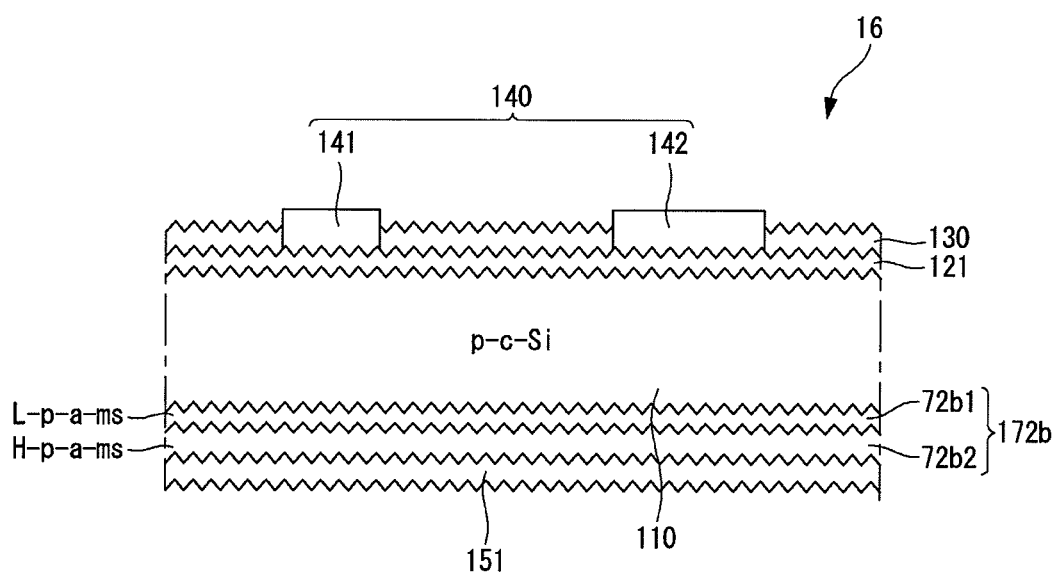
Figure 8:
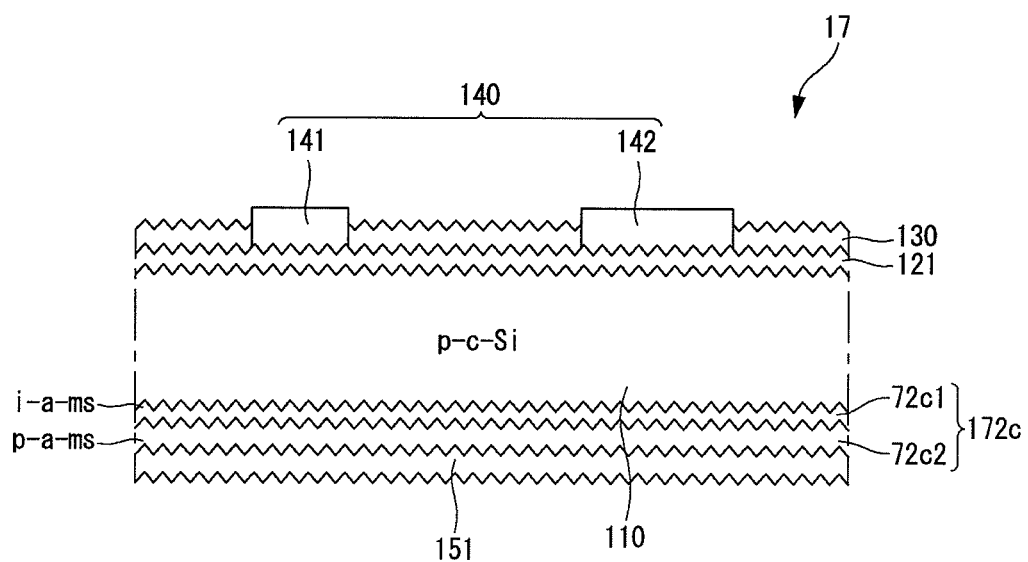

Each of solar cells 15-17 shown in FIGS. 6 to 8 has the same structure as that of the solar cell 11 of FIGS. 1 and 2, except the BSF regions 172a-172c.

In the solar cells 15-17 of FIGS. 6 to 8, each BSF region 172a-172c has the same structure and characteristic as each emitter region 121a-121c of FIGS. 3 to 5, except the conductivity type of impurities doped into the BSF regions 172a-172c. Thus, in each BSF region 172a-172c, the detailed descriptions of the same structure and/or characteristics of the BSF region 172a-172c as the corresponding emitter region 121a-121c are omitted.

In the solar cell 15 shown in FIG. 6, the BSF region 172a like the emitter region 121a in FIG. 3 contains impurities of a conductivity type (for example, a p-type) equal to the substrate 110 and includes two portions 72a1 and 72a2 having different metal contents from each other in accordance with a thickness variation of the BSF region 172a.

The first portion 72a1 is made of amorphous silicon, and thereby is a p-type amorphous silicon portion (p-a-Si), and the second portion 72a2 is made of amorphous metal silicide and thereby is a p-type amorphous metal silicide portion (p-a-ms).

The first and second portions 72a1 and 72a2 of the BSF region 172a may have the same impurity doped concentrations as one another, and the impurity doped concentrations of the first and second portions 72a1 and 72a2 of the BSF region 172a may have one within a range of approximately $1 \times 10^{16}$ to $1 \times 10^{21}$ atoms/cm$^3$, respectively.

The first portion 72a1 is in contact with the substrate 110 to form an upper surface of the BSF region 172a, and the second portion 72a2 is positioned on the first portion 72a1 and in contact with the back electrode 151 to form a lower surface of the BSF region 172a. Thus, in the same back surface position of the substrate 110, the minimum distance from the same back surface position to the first portion 72a1 is shorter than that to the second portion 72a2.

Like the emitter region 121a, the first portion 72a1 of the BSF region 172a may have a thickness of approximately 2 nm to 10 nm, and the second portion 72a2 of the BSF region 172a may have a thickness of approximately 5 nm to 20 nm.

When the thickness of the first portion 72a1 is approximately 2 nm or more, the first portion 72a1 stably performs the passivation function, and when the thickness of the first portion 72a1 is approximately 10 nm or less, an amount of light absorbed into the first portion 72a1 is further reduced.

When the thickness of the second portion 72a2 is approximately 5 nm or more, the second portion 72a2 more easily obtains the conductivity of a desired magnitude, and when the thickness of the second portion 72a2 is approximately 20 nm or less, the second portion 72a2 stably obtains the back surface field efficiency and the conductivity without unnecessary thickness increment.

In the solar cell 16 of the FIG. 7, like the emitter region 121b shown in FIG. 4, the BSF region 172b contains impurities of a conductivity type (for example, a p-type) equal to the substrate 110 and includes two portions 72b1 and 72b2 having different metal contents from each other in accordance with a thickness variation of the BSF region 172b.

The first portion 72b1 of the BSF region 172b is in contact with the substrate 110 and is made of amorphous metal silicide (L-p-a-ms) doped with p-type impurities. The second portion 72b2 of the BSF region 172b is positioned on the first portion 72b1 and contacts the back electrode 151 and is made of p-type amorphous metal silicide (H-p-a-ms). Thus, in the same back surface position of the substrate 110, the minimum distance from the same back surface position to the first portion 72b1 is shorter than that to the second portion 72b2.

In the example embodiment, an impurity doped concentration of the first portion 72b1 is less than that of the second portion 72b2.

For example, the impurity doped concentration of the first portion 72b1 may be one within a range of approximately $1 \times 10^{10}$ to $1 \times 10^{15}$ atoms/cm$^3$, and the impurity doped concentration of the second portion 72b2 may be one within a range of approximately $1 \times 10^{16}$ to $1 \times 10^{21}$ atoms/cm$^3$. However, in an alternative example, the BSF region 172b may have an impurity doped concentration linearly or nonlinearly changing from $1 \times 10^{10}$ atoms/cm$^3$ to $1 \times 10^{21}$ atoms/cm$^3$ in accordance with a change in a thickness of the BSF region 172b.

A portion of the first portion 72b1 contacting with the substrate 110 has the minimum impurity doped concentration (approximately $1 \times 10^{10}$ atoms/cm$^3$) and a portion of the second portion 72b1 contacting with the back electrode 151 has the maximum impurity doped concentration (approximately $1 \times 10^{21}$ atoms/cm$^3$).

The first portion 72b1 may have a thickness of approximately 5 nm to 10 nm and the second portion 72b2 may have a thickness of approximately 5 nm to 20 nm.

When the thickness of the first portion 72b1 is approximately 5 nm or more, the first portion 72b1 stably performs the passivation function in spite of the containing the impurity causing defects and the conductivity of the first portion 72b1 is further improved, and when the thickness of the first portion 72b1 is approximately 10 nm or less, an amount of light absorbed into the first portion 72b1 is further reduced.

When the thickness of the second portion 72b2 is approximately 5 nm or more, the second portion 72b2 more easily obtains the conductivity of a desired magnitude, and when the thickness of the second portion 72b2 is approximately 20 nm or less, the second portion 72b2 stably obtains the back surface field efficiency and the conductivity without unnecessary thickness increment.

In a similar manner as the emitter region 121c shown in FIG. 5, the solar cell 17 shown in FIG. 8 include the BSF region 172c having first and second portions 72c1 and 72c2. The first portion 72c1 is an intrinsic semiconductor portion and thereby is made of intrinsic amorphous metal silicide (i-a-ms) and the second portion 72c2 is a p-type semiconductor portion and thereby is made of p-type amorphous metal silicide (p-a-ms). Thereby, in FIG. 8, all of the first and second portions 72c1 and 72c2 are made of amorphous metal silicide.

As described above, the first portion 72c1 contacts the substrate 110 and the second portion 72c2 is positioned on the first portion 72b1 and contacts the back electrode 151. In the same back surface position of the substrate 110, the minimum distance from the same back surface position to the first portion 72c1 is also shorter than that to the second portion 72c2.

The second portion 72c2 may have an impurity doped concentration of one within a range of approximately $1 \times 10^{16}$ to $1 \times 10^{21}$ atoms/cm$^3$ or may have an impurity doped concentration linearly or nonlinearly changing from $1 \times 10^{16}$ atoms/cm$^3$ to $1 \times 10^{21}$ atoms/cut in accordance with a change in a thickness of the second portion 72c2.

In this instance, a portion of the minimum impurity doped concentration (approximately $1 \times 10^{15}$ atoms/cm$^3$) is a portion of the second portion 72c2 contacting with the first portion 72c1 and a portion of the maximum impurity doped concentration (approximately $1 \times 10^{21}$ atoms/cm$^3$) is a portion of the second portion 72c2 contacting with the back electrode 151.

The first portion 72c1 may have a thickness of approximately 2 nm to 10 nm and the second portion 72c2 may have a thickness of approximately 5 nm to 20 nm.

When the thickness of the first portion 72c1 is approximately 2 nm or more, the first portion 72c1 stably performs the passivation function, and when the thickness of the first portion 72c1 is approximately 10 nm or less, an amount of light absorbed into the first portion 72c1 is further reduced.

When the thickness of the second portion 72c2 is approximately 5 nm or more, the second portion 72c2 more easily obtains the conductivity of a desired magnitude, and when the thickness of the second portion 72c2 is approximately 20 nm or less, the second portion 72c2 stably obtains the back surface field efficiency and the conductivity without unnecessary thickness increment.

Similar to the solar cells 12-14 shown in FIGS. 3 to 5, since the second portions 72a2, 72b2, and 72c2 of the solar cells 15-17 contacting the back electrode 151 are made of amorphous metal silicide containing the metal material, an amount of charges transferred from the substrate 110 to the back electrode 151 increases, and thereby a transfer efficiency of the charges is improved.

Further, as compared with the solar cell 11 of FIGS. 1 and 2, the passivation function is performed by the first portions 72a1, 72b1 and 72c1 of the BSF region 172a-172c, which directly contact with the surface of the substrate 110 in the solar cells 15-17 and thus a loss amount of charges on and near the surface of the substrate 110 is reduced. Thereby, an efficiency of each solar cell 15-17 is improved, respectively.

The structures of the BSF regions 172a-172c described with reference to FIGS. 6 to 8 may be applied to the solar cells 12-14 of FIGS. 3 to 5 as well as the solar cell 11 of FIGS. 1 and 2, respectively, and the drawings or the detailed descriptions thereof are omitted.

Referring to FIGS. 9 to 12, various examples of a solar cell according to another embodiment of the invention are described. As compared with the solar cells 11-17 of FIGS. 1 to 8, the elements performing the same operations are indicated with the same reference numerals, and the detailed description thereof is omitted.

In the solar cells 18-21 shown in FIGS. 9 to 12, all output portions (e.g., a front electrode unit and a back electrode) outputting electrons and holes are positioned on a surface (a back surface) of the substrate 110 opposite an incident surface (i.e., a front surface) of the substrate 110 on which light is incident.

Thus, in the solar cells 18-21, the anti-reflection layer 130 is positioned on the incident surface (i.e., the front surface) of the substrate 110, and a plurality of emitter regions 122 or 122a-122c, and a plurality of BSF regions 173 or 173a-173c are positioned on the back surface of the substrate 110.

The plurality of emitter regions 122 or 122a-122c are spaced apart from each other and extend parallel to each other on the back surface of the substrate 110 in a predetermined direction. The plurality of BSF regions 173 or 173a-173c are spaced apart from the plurality of emitter regions 122 or 122a-122c and extend parallel to each other on the back surface of the substrate 110 in the same direction as the emitter regions 122 or 122a-122c. As shown in FIGS. 9 to 12, each emitter region 122 or 122a-122c and each BSF regions 173 or 173a-173c are alternatively positioned on the back surface of the substrate 110.

Each solar cell 18-21 includes a plurality of first electrodes 141a and a plurality of second electrodes 141b on the plurality of emitter regions 122 or 122a-122c and the plurality of BSF regions 173 or 173a-173c, respectively. Thus, the plurality of first electrodes 141a output charges (for example, electrons) that moved to the plurality of emitter regions 122 or 122a-122c to an external device, and the plurality of second electrodes 142a output charges (for example, holes) that moved to the plurality of BSF regions 173 or 173a-173c to the external device. In this instance, the plurality of first and second electrodes 141a and 141b are metal electrodes containing a metal material such as aluminum (Al), etc., in a similar manner to the front electrode unit 140 or the back electrode 151 of FIGS. 1-8.

In addition, each solar cell 18-21 further includes a passivation layer 192 on portions of the substrate 110 positioned between two adjacent emitter region 122 or 122a-122c and BSF region 173 or 173a-173c. The passivation layer 192 is positioned on the back surface of the substrate except on portions of the back surface of the substrate 110 on which the plurality of emitter regions 122 or 122a-122c and the plurality of BSF regions 173 or 173a-173c are positioned. The passivation layer 192 is made of an insulating material such as silicon oxide (SiOx:H), silicon nitride (SiNx:H) or intrinsic amorphous silicon, etc.

The passivation layer 192 perform a passivation function that converts unstable bonds, such as a dangling bond, existing on and around the surface of the substrate into stable bonds to thereby prevent or reduce a recombination and/or a disappearance of carriers moving to each of the surface of the substrate 110 resulting from the unstable bonds.

Further, by the passivation layer 192 made of the insulating material, an electric interference such as the movement of charges between adjacent emitter region 122 or 122a-122c and BSF region 173 or 173a-173c is prevented or reduced to decrease a loss of charges. In addition, light passing through the substrate 110 is reflected by the passivation layer 192 and then is again incident on the substrate 110. Hence, an amount of light lost toward the outside is reduced.

Each solar cell 18-21 may further include a bus bar connected to the plurality of first electrodes 141a and a bus bar connected to the plurality of second electrodes 141b and outputting charges transferred to the plurality of first and second electrodes 141a and 141b to the external device.

Except the formation position and number of the plurality of emitter regions 122 or 122a-122c and the plurality of BSF regions 173 or 173a-173c, each emitter region 122 or 122a-122c and each BSF region 173 or 173a-173c have the same characteristics as the corresponding emitter region and BSF region of the emitter regions 121 and 121a-121c and the BSF regions 172 and 172a-172c of FIGS. 1 to 8. Thus, except the formation position and number of the plurality of emitter regions 122 or 122a-122c and the plurality of BSF regions 173 or 173a-173c, the emitter regions 122 or 122a-122c and the BSF regions 173 or 173a-173c are equal to at least one of the emitter regions 121 or 121a-121c and the BSF regions 172 or 172a-172c, and the detailed description thereof is omitted.

Figure 9:
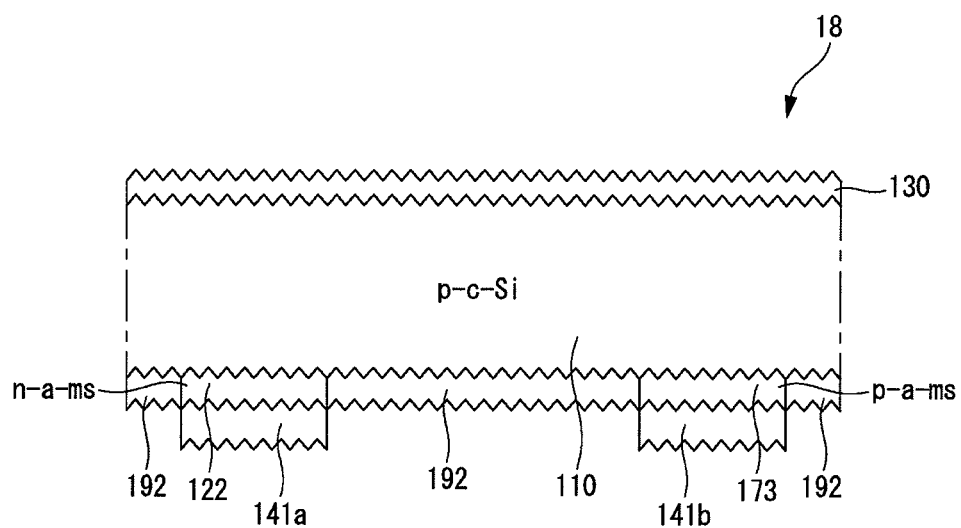
FIGS. 9 to 12 are partial sectional views of various solar cells according to example embodiments of the invention, respectively.

In the solar cell 18 shown in FIG. 9, the plurality of emitter regions 122 are similar to the emitter region 121 of FIGS. 1 and 2, and thereby are made of amorphous metal silicide (n-a-ms) containing impurities of a conductivity type (for example, an n-type) different from the substrate 110, and the plurality of BSF regions 173 are similar to the BSF region 172 of FIGS. 1 and 2 and thereby are made of amorphous metal silicide (p-a-ms) containing impurities of a conductivity type (for example, a p-type) equal to the substrate 110.

Figure 10:
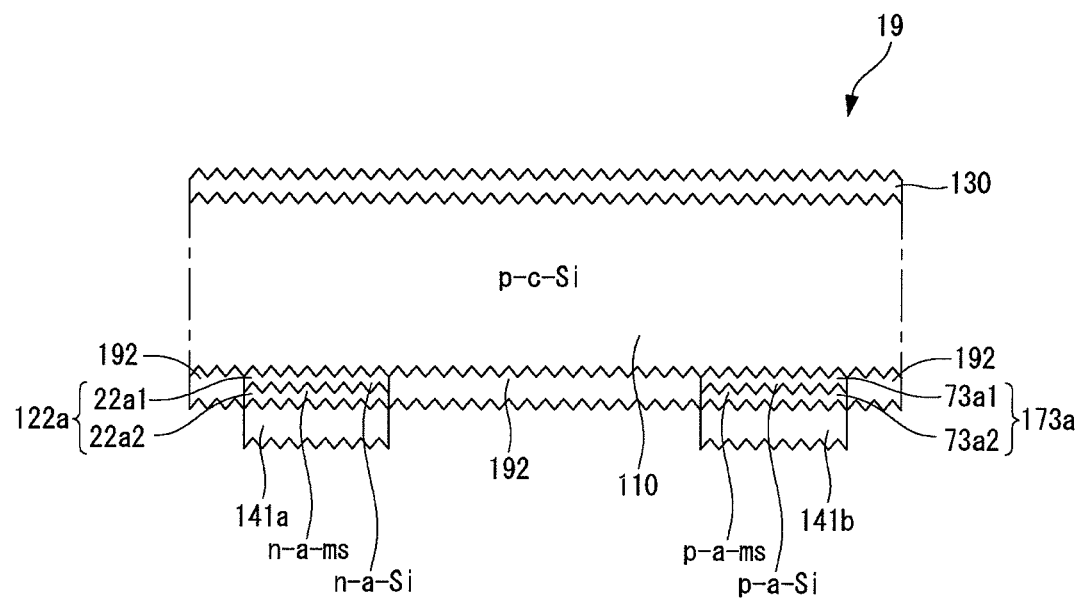

In the solar cell 19 shown in FIG. 10, each emitter region 122a corresponds to the emitter region 121a of FIG. 3, and thereby includes a first portion 22a1 (an n-type amorphous silicon portion, n-a-Si) made of amorphous silicon and a second portion 22a2 (an n-type amorphous metal silicide, n-a-ms) positioned on the first portion 22a1 and made of amorphous metal silicide containing a metal material, and each BSF region 173a corresponds to the BSF region 172 of FIG. 6 and thereby includes a first portion 73a1 (a p-type amorphous silicon portion, p-a-Si) made of amorphous silicon and a second portion 73a2 (a p-type amorphous metal silicide, p-a-ms) positioned on the first portion 73a1 and made of amorphous metal silicide containing a metal material.

Figure 11:
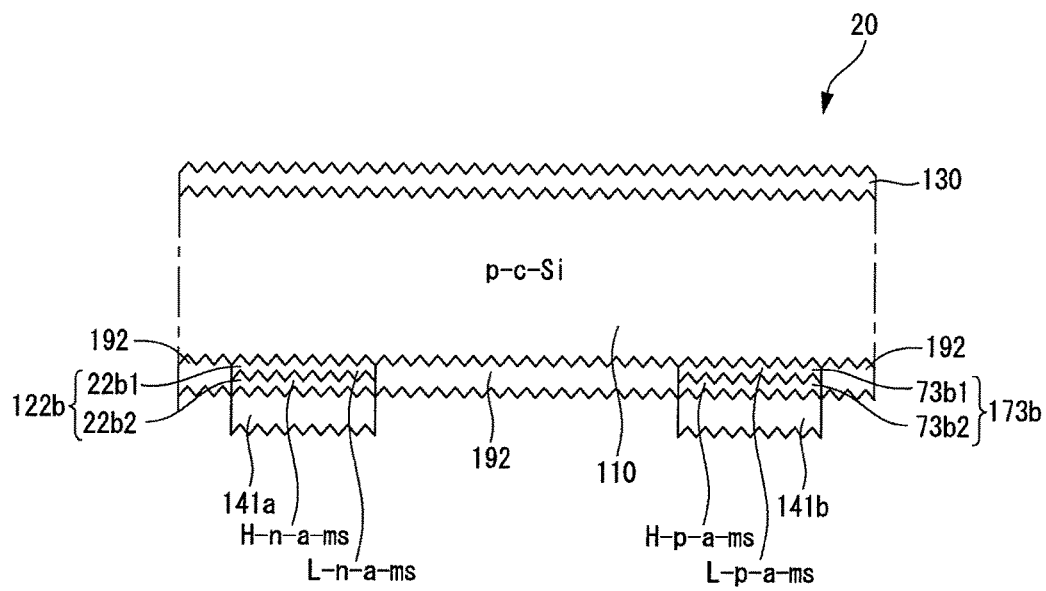

In the solar cell 20 shown in FIG. 11, each emitter region 122b is similar to the emitter region 121b of FIG. 4 and includes a first portion 22b1 (L-n-a-ms) made of amorphous metal silicide and a second portion 22b2 (H-n-a-ms) positioned on the first portion 22b1 and made of amorphous metal silicide, and each BSF region 173b is similar to the BSF region 172b of FIG. 7 and includes a first portion 73b1 (L-p-a-ms) made of amorphous metal silicide and a second portion 73b2 (H-p-a-ms) positioned on the first portion 73b1 and made of amorphous metal silicide. Impurity doped concentrations of the first portions 73b1 and 22b1 of the BSF region 173 and the emitter region 122b are less than impurity doped concentrations of the second portions 73b2 and 22b2 of the BSF region 173 and the emitter region 122b, respectively.

Figure 12:
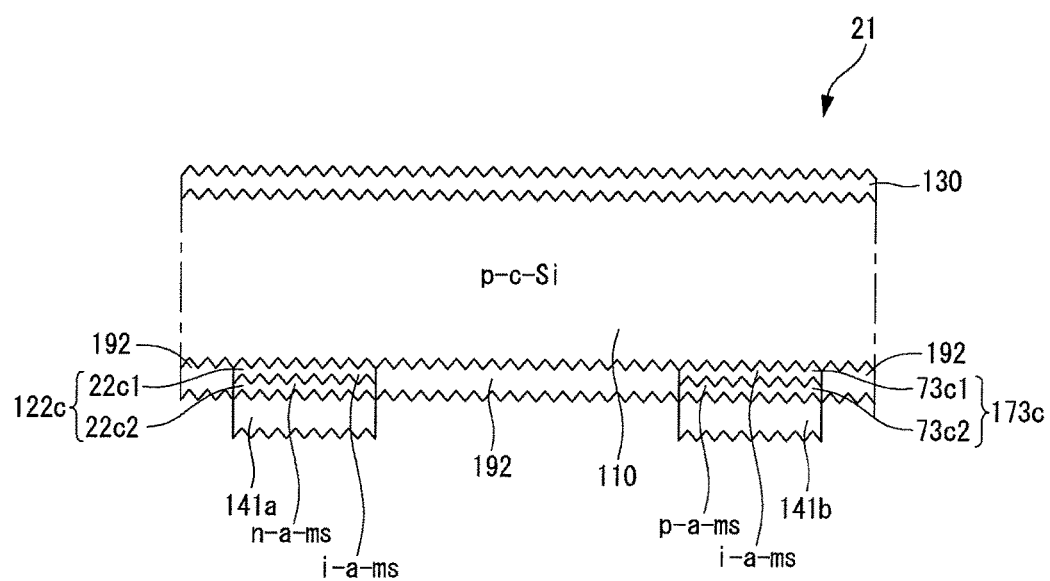

In the solar cell 21 shown in FIG. 12, each emitter region 122c is similar to the emitter region 121c shown in FIG. 5 and each BSF region 173c is similar to the BSF region 172c shown in FIG. 8.

Thus, each emitter region 122c and each BSF region 173 include first portions 22c1 and 73c1 (i-a-ms) made of intrinsic amorphous metal silicide and second portions 22c2 and 73c2 (n-a-ms and p-a-ms) positioned on the first regions 22c1 and 73c1 and made of amorphous metal silicide containing n-type or p-type impurities, respectively.

In FIGS. 10 to 12, the first portion 22a1, 22b1 and 22c1 of each emitter region 122a-122c, respectively, contacts the back surface of the substrate 110 to form an upper surface of the emitter region 122a-122c, and the second portion 22a2, 22b2 or 22c2 of each emitter region 122a-122c, respectively, is positioned on the first portion 22a1, 22b1 or 22c1 and contacts the first electrode 141a to form a lower surface of the emitter region 122a-122c. similarly, the first portion 73a1, 73b1 or 73c1 of each BSF region 173a-173c, respectively, contacts the back surface of the substrate 110 to form an upper surface of the BSF region 173a-173c, respectively, and the second portion 73a2, 73b2 or 73c2 of each BSF region 173a-173c is positioned on the first portion 73a1, 73b1 or 73c1 and contacts the second electrode 141b to form a lower surface of the BSF region 173a-173c. Thus, in the same back surface position of the substrate 110, the minimum distance from the same back surface position to the first portion 22a1, 22b1, 22c1, 73a1, 73b1, or 73c1 is shorter than that to the second portion 22a1, 22b1, 22c1, 73a2, 73b2, or 73c2.

As compared with the solar cells 11-17 shown in FIGS. 1 to 8, since the plurality of first and second electrodes 141a and 141b are positioned on the back surface opposite the incident surface (i.e., the front surface) of the substrate 110, an incident area of the substrate 110 increases to improve the efficiency of the solar cells 18-21, respectively.

In the solar cells 18-21, since the plurality of emitter regions 122 or 122a-122c, and the plurality of BSF regions 173 or 173a-173c, which contact the plurality of first and second electrodes 141a and 141b, are made of amorphous metal silicide containing the metal material, each of the plurality of emitter portions 122 or 122a-122c, and the plurality of BSF portions 173 or 173a-173c have a good conductivity. Thus, in contrast to a case with a plurality of emitter regions and a plurality of BSF regions that are made of amorphous silicon having a high resistance and a poor conductivity, the solar cells 18-21 do not need to form separate layers made of a transparent conductive material between the emitter regions 122 or 122a-122c and the first electrodes 141a, and between the BSF regions 173 or 173a-173c and the second electrodes 141b. Thus, a manufacturing time and a manufacturing cost of each solar cell 18-21 decreases and the efficiency of the solar cell 18-21 is improved.

Further, like each solar cell 12-17 shown in FIGS. 3 to 8, since the emitter regions 122a-122c or/and the BSF regions 173a-173c of each solar cell 19-21, which directly contact the substrate 110 are made of amorphous silicon, intrinsic amorphous silicon (that is, amorphous silicon having an impurity doped concentration of substantially 0 atoms/cm$^3$), or amorphous metal silicide having a low impurity doped concentration, interface characteristics between the substrate 110 and the emitter regions 122a-122c) or/and between the substrate 110 and the BSF regions 173a-173c are improved to decrease a loss of charges due to the defects on and near the surface of the substrate 110 and to further increase the efficiency of the solar cells 19-21.

Each solar cell 18-21 shown in FIGS. 9-12 may have a plurality of emitter regions and a plurality of BSF region of another structure, instead of the emitter regions 122 or 122a-122c and the BSF regions 173 or 173a-173c. For example, a solar cell may have the plurality of emitter regions 122 of FIG. 9 and the plurality of BSF regions 173a of FIG. 10.

Figure 13A:
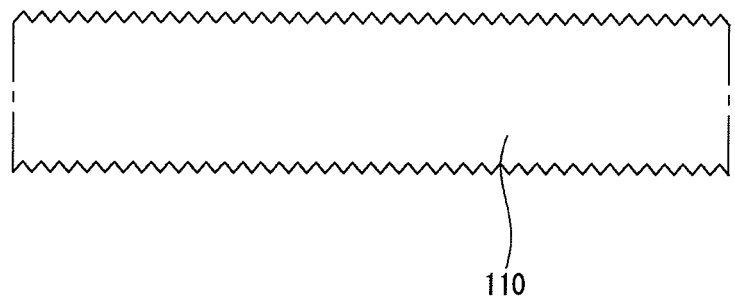
FIGS. 13A to 13H are partial sectional views sequentially illustrating a manufacturing method of a solar cell according to an example embodiment of the invention.

Next, referring to FIGS. 13a to 13h, a method for manufacturing the solar cell 11 shown in FIGS. 1 and 2 is described. As shown in FIG. 13A, a textured surface (an uneven surface) on the planar front and back surfaces of the substrate 110 made of, for example, p-type polycrystalline silicon is formed by using a wet etching, etc. Alternatively, when the textured surface is to be formed on only the front surface on which light is incident, a separate etch stop layer is formed on the back layer, and then the etching process is performed to form the textured surface on only a desired surface (i.e., the front surface) of the substrate 110.

Figure 13B:
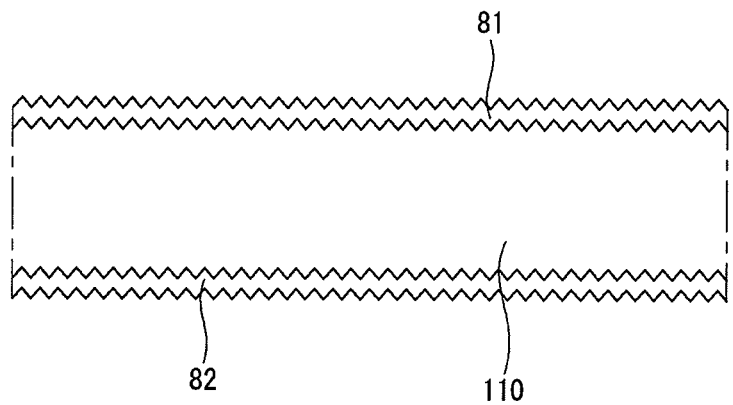

Next, referring to FIG. 13B, metal layers 81 and 82 are formed on the front and back surfaces of the substrate 110 using a layer formation process such as a sputtering process or an evaporation process, etc., respectively. The metal layers 81 and 82 contain at least one metal material of Cr, Al, Co, Hf, Mo, Ni, Pd, Pt, Ta, Ti, and Zr. In forming the metal layers 81 and 82, the front surface of the substrate 110 is exposed to the metal material to form the metal layer 81 on the front surface of the substrate 110 and then the back surface of the substrate 110 is exposed to the metal material to form the metal layer 82 on the back surface of the substrate 110. A formation order of the metal layers 81 and 82 may be changed. Each of the metal layers 81 and 82 may have a thickness of approximately 0.5 nm to 2 nm.

Figure 13C:
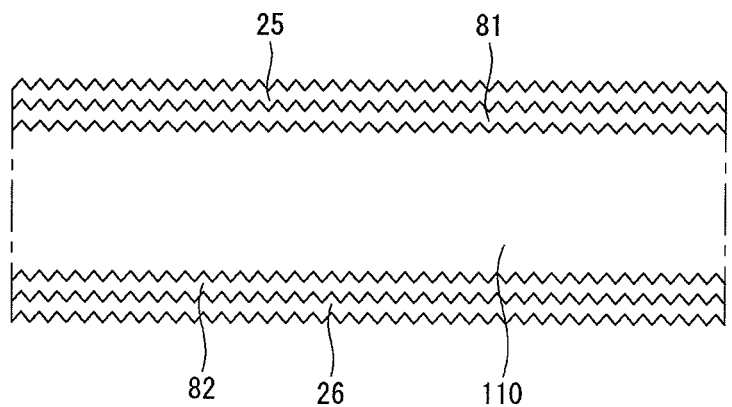

As shown in FIG. 13C, an amorphous silicon layer 25 containing impurities of a conductivity type (for example, an n-type) different from the substrate 110 is formed on the metal layer 81, which is positioned on the front surface of the substrate 110 and then an amorphous silicon layer 26 containing impurities of a conductivity type (for example, a p-type) equal to the substrate 110 is formed on the metal layer 82, which is positioned on the back surface of the substrate 110. In this instance, the n-type or p-type amorphous silicon layers 25 and 16 may be formed in the same chamber or may be formed in different chambers, respectively. When the metal layers 25 and 26 are formed in the same chamber, only process gases supplied into the chamber for the conductivity type of the impurities may be changed. A formation order of the amorphous silicon layers 25 and 26 may be also changed.

Thicknesses of the amorphous silicon layers 25 and 26 are defined in accordance with thicknesses of an emitter region and a BSF region, which are formed later. In the example embodiment, each of the amorphous silicon layers 25 and 26 may be approximately 7 nm to 30 nm.

Figure 13D:
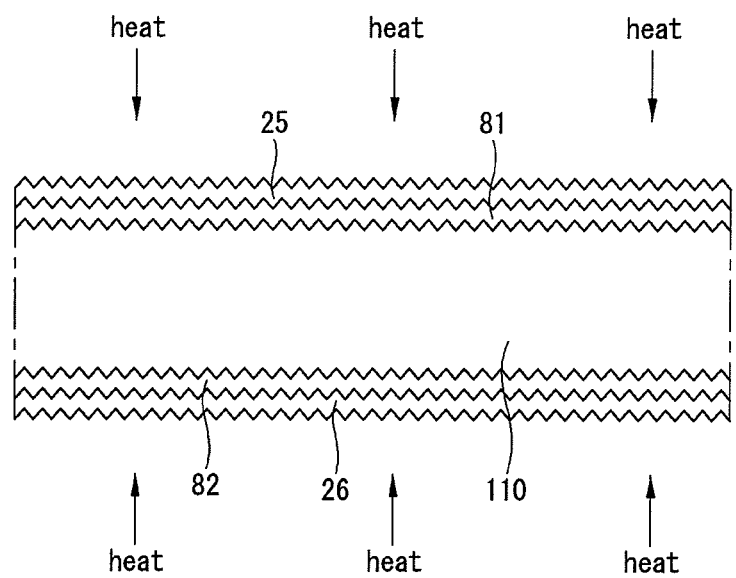
Figure 13E:
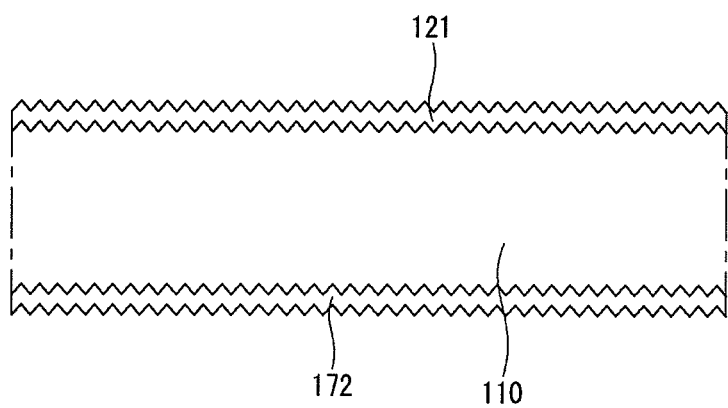

As shown in FIG. 13D, a thermal process is performed on the metal layers 81 and 82 and the amorphous silicon layers 25 and 26 positioned on the metal layers 81 and 82 at a predetermined temperature, for example, about 100° C. to 400° C. Thus, by the thermal process, amorphous silicon contained in the amorphous silicon layers 25 and 26 and the metal material contained in the metal layers 81 and 82 are combined to form amorphous metal silicide and to thereby form an emitter region 121 made of n-type amorphous metal silicide on the front surface of the substrate 110 and a BSF region 172 made of p-type amorphous metal silicide on the back surface of the substrate 110 (see FIG. 13E).

In this example embodiment, each metal layer 81 and 82 has a thickness of approximately 0.5 nm to 2 nm. When the thickness of each metal layer 81 and 82 is approximately 0.5 nm and more, the metal layers 81 and 82 are further uniformly applied on the substrate 110, and when the thickness of each metal layer 81 and 82 is approximately 2 nm and less, the entire metal layers 81 and 82 are stably changed into amorphous metal silicide by the overlaying amorphous silicon layers 25 and 26.

As described above, the emitter region 121 and the BSF region 172 of amorphous metal silicide are formed by one thermal process, but the emitter region 121 and the BSF region 172 may be formed by separate thermal processes, respectively.

That is, after forming the amorphous silicon layer 81 and the metal layer 25 on the front surface of the substrate 110, a thermal process is performed on the metal layer 25 and the amorphous silicon layer 81 to form the emitter region 121, and then after forming the amorphous silicon layer 82 and the metal layer 26 on the back surface of the substrate 110, a thermal process is performed on the metal layer 26 and the amorphous silicon layer 82 to form the BSF region 172. A formation order of the emitter region 121 and the BSF region 172 may be changed. In this instance, since the two thermal processes are separately performed for forming the emitter region 121 and the BSF region 172, conditions of the thermal processes may be precisely controlled considering the characteristics and so on of the emitter region 121 and the BSF region 172. Thus, the characteristics and quality of the emitter region 121 and the BSF region 172 are improved.

In an alternative example embodiment, when the BSF region 172 is made not of amorphous metal silicide but of amorphous silicon, the BSF region 172 containing p-type impurities may be formed on the back surface of the substrate 110 by a PECVD (plasma enhanced chemical vapor deposition) method etc., in a separate way from the process for the emitter region 121 using the metal layer 81 and the amorphous silicon layer 25. A formation order of the emitter region 121 and the BSF region 172 may be also changed.

Figure 13F:
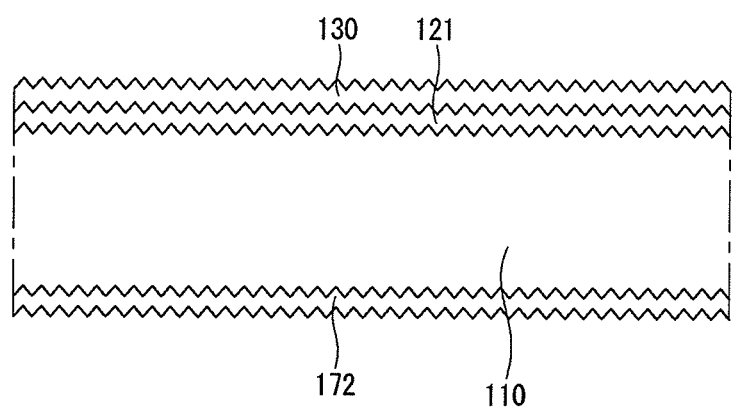
Figure 13G:
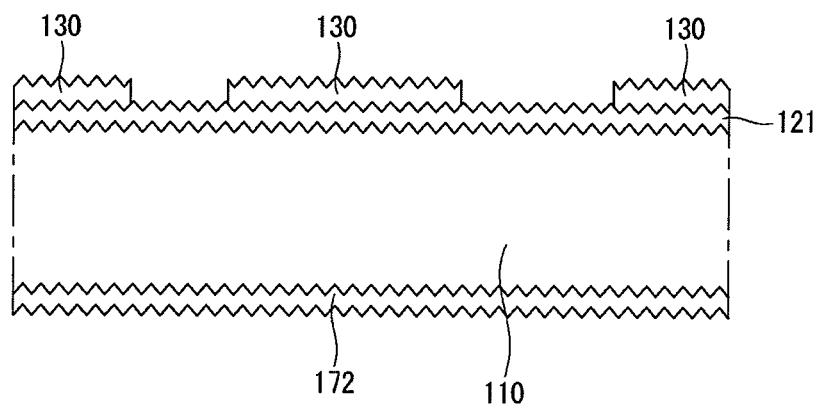

Next, referring to FIGS. 13F and 13G, the anti-reflection layer 130 is formed using a PECVD method, etc., on the emitter region 121, and then portions of the anti-reflection layer 130 are removed to expose portion of the emitter region 121. The anti-reflection layer 130 may be made of hydrogenated silicon oxide (SiOx:H) or hydrogenated silicon nitride (SiNx:H), etc.

Figure 13H:
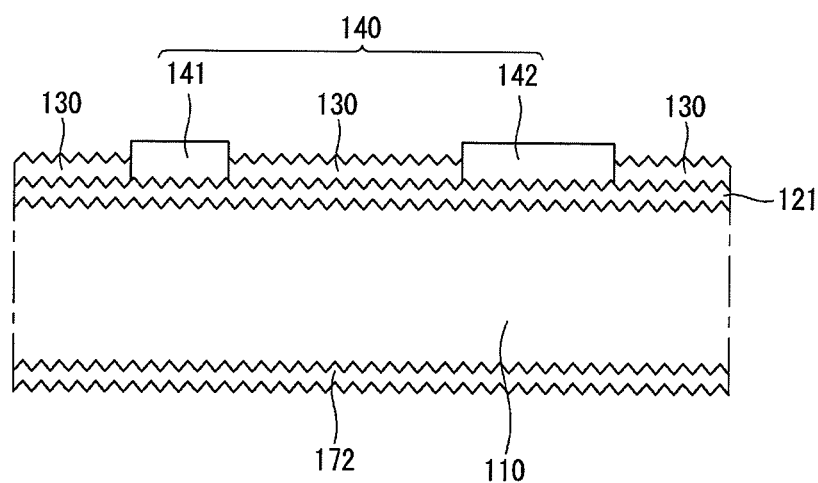

As shown in FIG. 13H, a front electrode unit paste is applied (or printed) on the exposed portions of the emitter region 121 using a screen printing method, and then a thermal process is performed on the front electrode unit paste at a low predetermined temperature such as, for example, about 120° C. to 200° C., to dry the front electrode unit paste. Thereby, a front electrode unit 140 including a plurality of front electrodes 141 and a plurality of front bus bars 142 is formed. In the example embodiment, the front electrode unit paste contains at least one metal material such as silver (Ag).

Thus, the exposed portions of the emitter region 121 are divided into portions for the plurality of front electrode 141 and portions for the plurality of front bus bars 142.

After the formation of the front electrode unit 140, a back electrode paste containing at least one conductive material such as aluminum (Al) is applied on the back surface of the substrate 110 using a screen printing method and dried at a low temperature, to form a back electrode 151 on the back surface of the substrate 110 (FIGS. 1 and 2).

A formation order of the front electrode unit 140 and the back electrode 151 may be changed.

In this example embodiment, since a separate transparent conductive layer such as a TCO layer between the emitter region 121 and the front electrode unit 140 is not necessary, manufacturing time and cost of the solar cell 11 decrease.

Further, since the emitter region 121 and the BSF region 172 respectively contacting the front electrode unit 140 and the back electrode 151 are made of metal silicide such as amorphous metal silicide, the conductivity of the emitter region 121 and the BSF region 172 increase to improve a transfer efficiency of charges from the substrate 110 to the front electrode unit 140 and the back electrode 151.

Referring to FIGS. 14A to 14F, when at least one of the emitter regions 121a-121c and the BSF regions 172a-172c includes first portions 21a1, 21b1, 21c1, 72a1, 72b1 or 72c1 of p-type or n-type amorphous silicon and second portions 21a2, 21b2, 21c2, 72a2, 72b2 or 72c2 of p-type or n-type amorphous metal silicide, a method for manufacturing at least one of the emitter regions 121a-121c and the BSF regions 172a-172c is described.

Figure 14A:
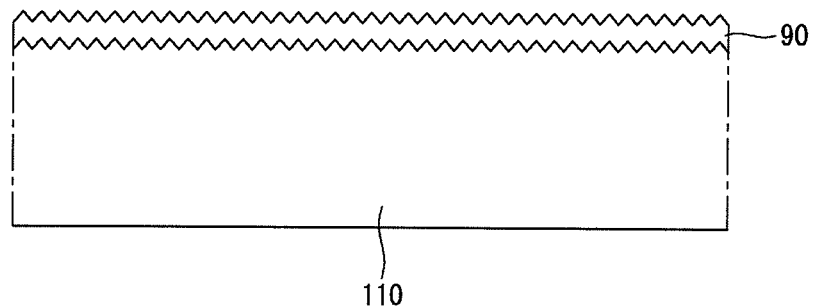
FIGS. 14A to 14F illustrate a method for forming an amorphous silicon layer and an amorphous metal silicide layer for a solar cell according to an example embodiment of the invention.
Figure 14B:
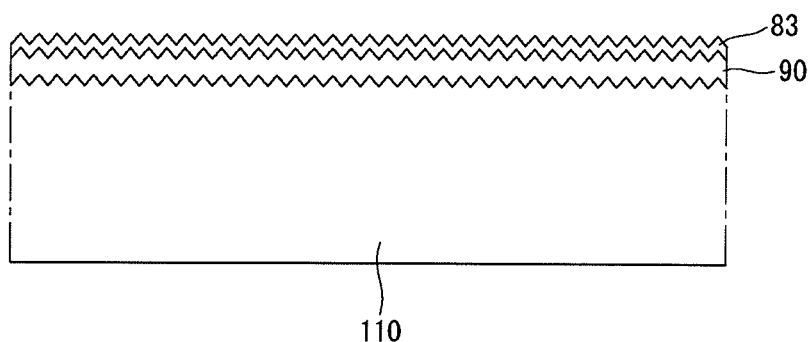
Figure 14C:
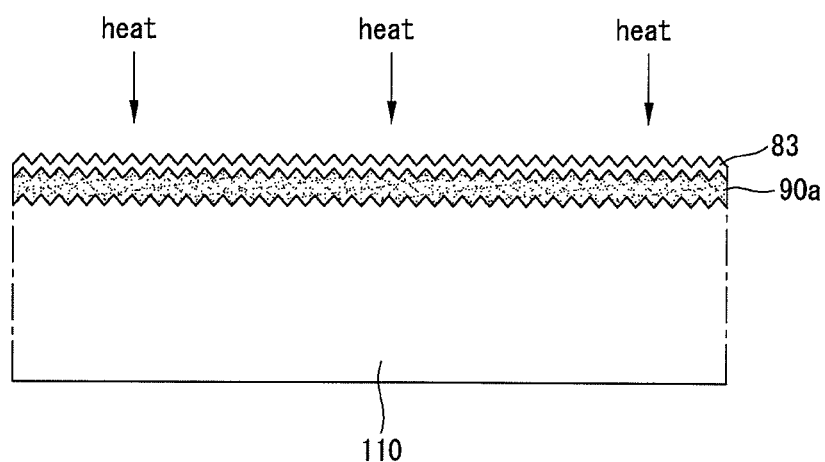

As shown in FIG. 14A, after forming an amorphous silicon layer 90 on the substrate 110 (for example, a p-type) containing impurities of a first conductivity type (for example, a p-type) using a PECVD method, etc, a metal layer 83 is formed by a sputtering method or a vapor deposition method (see FIG. 14B). The substrate 110 may be a polycrystalline silicon substrate. The amorphous silicon layer 90 is of a p-type or an n-type, or the amorphous silicon layer 90 is made of intrinsic amorphous silicon. The metal layer 83 contains at least one metal material of Cr, Al, Co, Hf, Mo, Ni, Pd, Pt, Ta, Ti, W, and Zr. The metal layer 83 may have a thickness of approximately 1 nm to 100 nm.

The amorphous silicon layer 90 may have an impurity doped concentration from substantially 0 atoms/ad (i.e., an intrinsic semiconductor) to approximately $1 \times 10^{21}$ atoms/cm$^3$, or from approximately $1 \times 10^{10}$ atoms/cm$^3$ to approximately $1 \times 10^{21}$ atoms/cm$^3$, by adjusting an amount of the impurities of a p-type or an n-type injected into a chamber in accordance with the emitter regions 121a-121c or the BSF regions 172a-172c of the solar cells 12-17 shown in FIGS. 3 to 8. According to the characteristics of the emitter regions 121a-121c or the BSF regions 172a-172c, the impurity doped concentration of the emitter regions 121a-121c or the BSF regions 172a-172c may be linearly or nonlinearly changed, and in an alternative example embodiment, the impurity doped concentration of the emitter regions 121a-121c or the BSF regions 172a-172c may first be maintained at a predetermined value and then be linearly or nonlinearly changed.

Figure 14D:
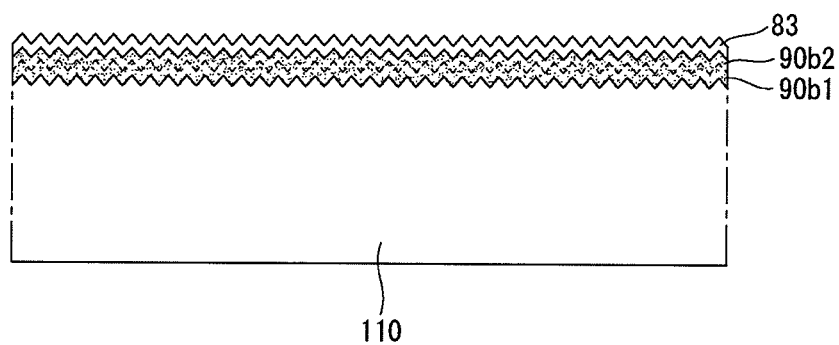

Next, a thermal process at a predetermined temperature (for example, about 100° C. to 500° C.) is performed on the amorphous silicon layer 90 and the metal layer 82, and thereby the entire amorphous silicon layer 90 of a p-type or an n-type, or an intrinsic type is changed into amorphous metal silicide to form the amorphous metal silicide 90a on the substrate 110 (see FIG. 14C), or a portion of the amorphous silicon layer 90, which are positioned on and around a surface contacted to the metal layer 83 is changed into the amorphous metal silicide (see FIG. 14D).

In this instance, the change of the amorphous silicon layer 90 into the amorphous metal silicide occurs from a contact surface between the amorphous silicon layer 90 and the metal layer 83 to a lower surface of the amorphous silicon layer 90, and a changed amount into the amorphous metal silicide of the amorphous silicon layer 90 is varied in accordance with conditions of the thermal process such as a thermal process temperature and a thermal process time, etc.

Next, the remaining portion of the metal layer 83, which is not changed into the amorphous metal silicide is removed using an etching method, such as a wet etching method.

Figure 14E:
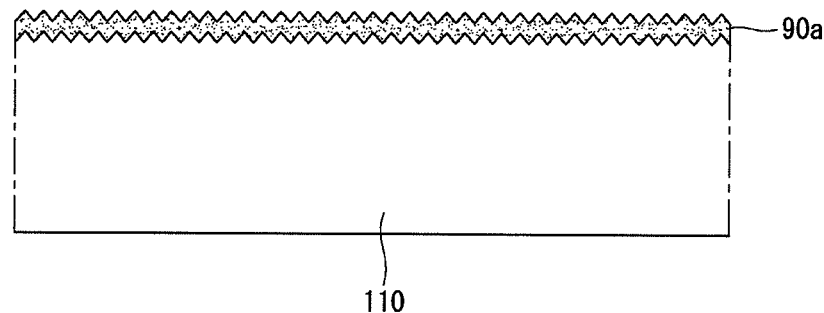
Figure 14F:
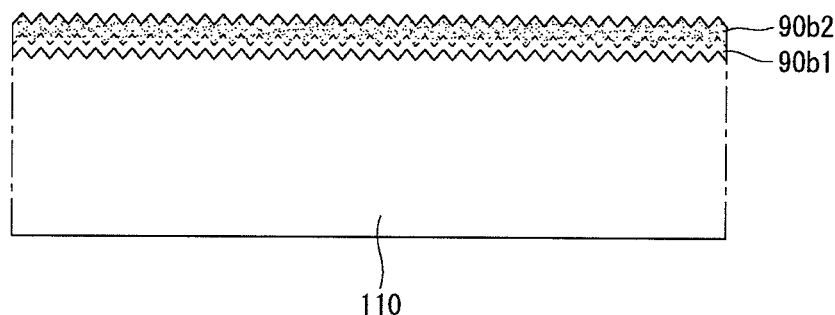

Thereby, as shown in FIG. 14E, the entire amorphous silicon layer 90 is formed as the amorphous metal silicide of the p-type or n-type on the substrate 110 (for example, the solar cells of FIGS. 1, 2, 4, 5, 7 and 8). In another method, as shown in FIG. 14F, a portion of the amorphous silicon layer 90 is formed into the amorphous metal silicide and may include an intrinsic silicon layer 90b1 or an amorphous silicon layer 90b1 of the p-type or n-type and the amorphous metal silicide layer 90b2 on the layer 90b1 (for example, the solar cells of FIGS. 3 and 6).

Figure 17:
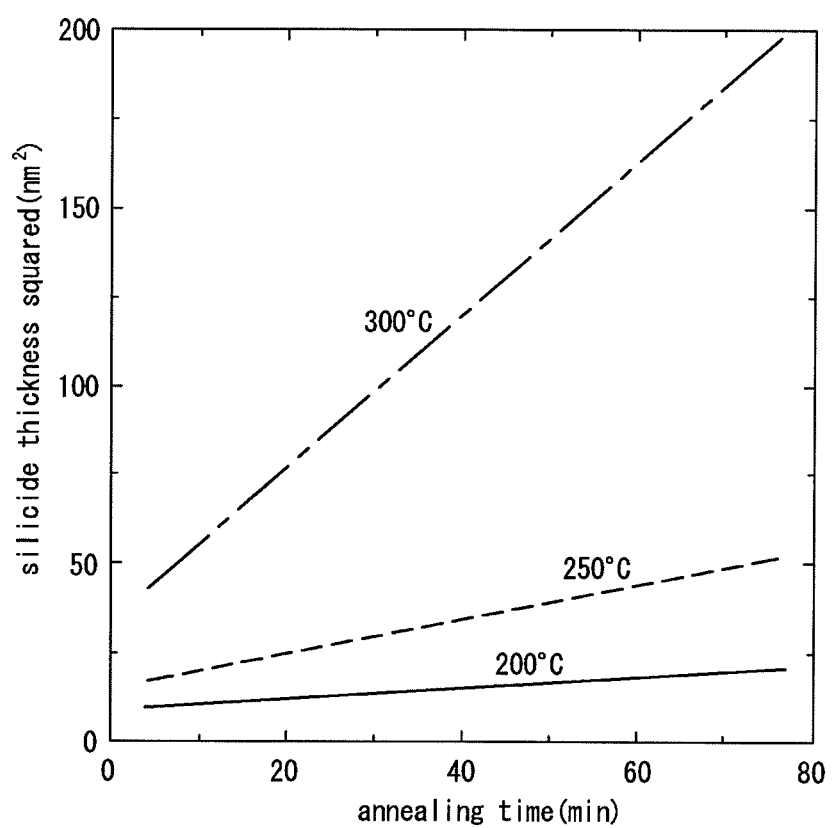
FIG. 17 is a graph showing a variation of a thickness of an amorphous silicon layer positioned on a metal layer being changed into an amorphous metal silicide in accordance with a thermal process time and a thermal temperature, when the metal layer using chrome (Cr) is heated.

Referring to FIG. 17, the changed amount into metal silicide such as amorphous metal silicide is varied by the thermal process temperature and the thermal process time. When thermal-processing the metal layer containing chromium (Cr), FIG. 17 shows a thickness variation of an amorphous silicon layer changed into amorphous metal silicide in accordance with the thermal process temperature and the thermal process time.

A thickness of the metal layer 83 for changing at least one portion of the amorphous silicon layer 90 into the amorphous metal silicide is varied based on a thickness of the amorphous silicon layer 90 underlying the metal layer 83, a desired changed degree of the amorphous silicon layer 90 into the amorphous metal silicide and the thermal process temperature, etc. As already described, the thickness of the metal layer 83 may be approximately 1 to 100 nm.

Referring to FIGS. 15A to 15H, an example method for manufacturing the solar cells 18-21 shown in FIGS. 9-12 is described.

The same descriptions as those explained with reference to FIGS. 13A to 13H and FIGS. 14A to 14F are omitted.

Figure 15A:
FIGS. 15A to 15H are partial sectional views sequentially illustrating a manufacturing method of the solar cells of FIGS. 9 to 12 according to an example embodiment of the invention.

Referring to FIG. 15A, a textured surface is formed on planar front and back surfaces of the substrate 110 of a first conductivity type (for example a p-type).

Figure 15B:
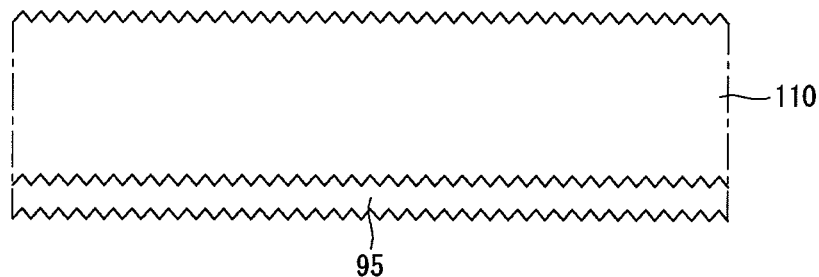
Figure 15C:
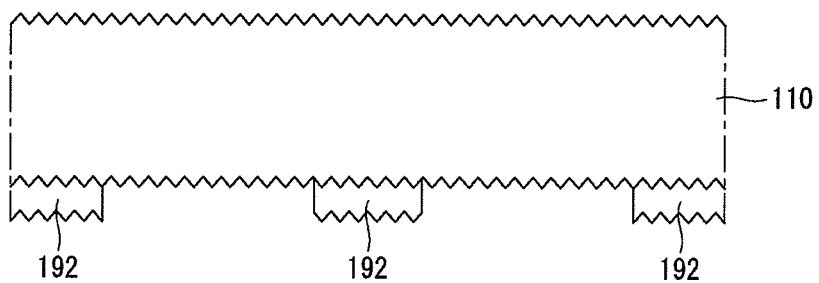

Next, referring to FIG. 15B, a layer 95 made of silicon oxide or silicon nitride, etc., is formed on one (that is, a surface opposite an incident surface) of the surfaces of the substrate 110 and then desired portions of the layer 95 are removed by an etching method to form a passivation layer 192 on the surface (i.e., a back surface) of the substrate 110 as shown in FIG. 15C.

Figure 15D:
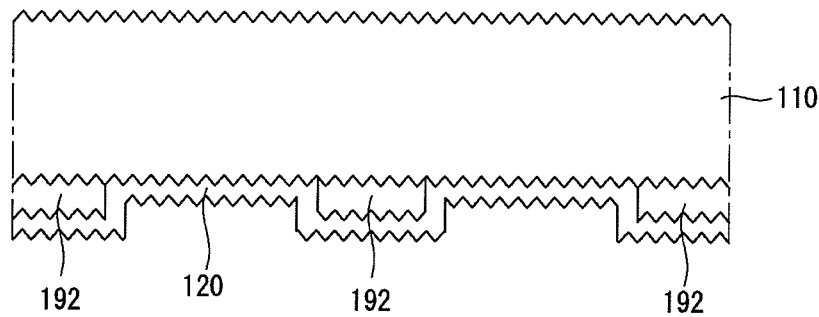
Figure 15E:
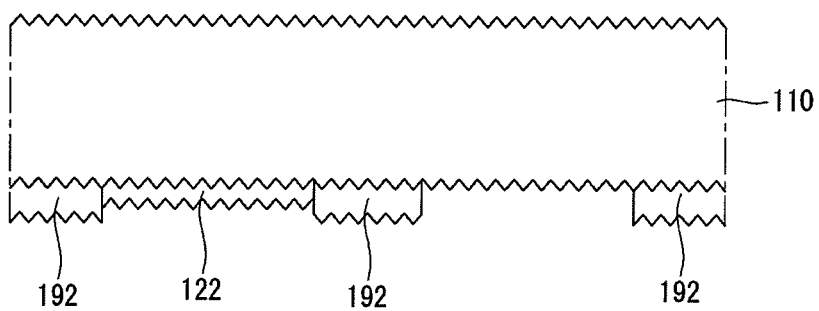

Referring to FIG. 15D, an emitter layer 120 of a second conductivity type (for example, an n-type) is formed on exposed portions of the substrate 110, on which the passivation layer 192 is not formed, and on the passivation layer 192, and then desired portions of the emitter layer 120 are partially removed to form a plurality of emitter regions 122 connected to the passivation layer 192 as shown in FIG. 15E).

In this instance, as described referring to FIGS. 14A to 14F, the emitter layer 120 is formed through processes of forming an amorphous silicon layer of the n-type by controlling a content or a flow rate of an impurity injected into a chamber, and forming a metal layer and performing a thermal treatment, so that the emitter layer 120 is formed into one of the emitter regions 122 and 122a-122c shown in FIGS. 9 to 12.

Figure 15F:
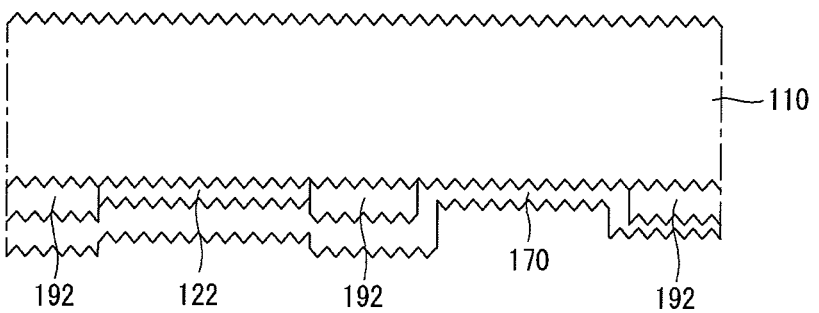
Figure 15G:
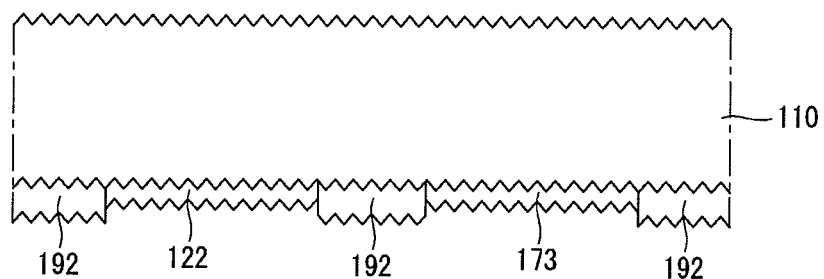

Referring to FIG. 15F, a BSF layer 170 of the first conductivity type (for example, the p-type) is formed on the exposed portions of the substrate 110, the passivation layer 192 and the emitter regions 122, and then desired portions of the BSF layer 170 are partially removed to form a plurality of BSF regions 173 connected to adjacent passivation layer 192 as shown in FIG. 15G. Thereby, two adjacent emitter region 122 and the BSF region 173 are separated by the passivation layer 192 positioned between the two adjacent emitter region 122 and the BSF region 173.

In a manner similar to the emitter regions 122, as described with reference to FIGS. 14A to 14F, the BSF layer 170 is formed through processes of forming an amorphous silicon layer of the p-type by controlling a content or a flow rate of an impurity injected into a chamber, and forming a metal layer and performing a thermal treatment, so that the BSF layer 170 is formed into one of the BSF reigns 173 and 173a-173c shown in FIGS. 9 to 12.

Figure 15H:
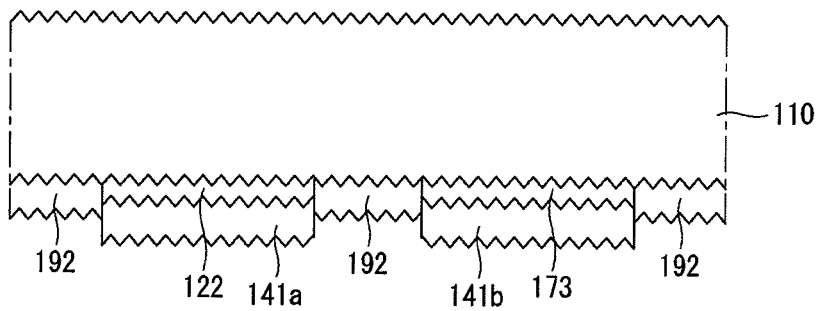

Referring to FIG. 15H, a paste containing at least one metal material such as silver (Ag) or aluminum (Al) is applied on the plurality of emitter regions 122 and the plurality of BSF regions 173 using a screen printing method and dried, to form a plurality of first electrodes 141a and a plurality of second electrodes 141b on the plurality of emitter regions 122 and the plurality of BSF regions 173, respectively. In an alternative example embodiment, the plurality of first and second electrodes 141a and 141b may be formed by other methods such as a sputtering method.

Referring to FIGS. 16a to 16I, an example method for manufacturing the solar cells 18-21 shown in FIGS. 9 to 12 is described. The same descriptions as those explained with reference to FIGS. 13A to 13H, FIGS. 14A to 14F, and FIGS. 15A to 15H are omitted.

Figure 16A:
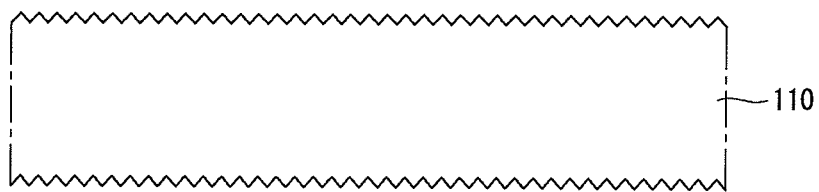
FIGS. 16A to 16I are partial sectional views sequentially illustrating another manufacturing method of the solar cells of FIGS. 9 to 12 according to an example embodiment of the invention.
Figure 16B:
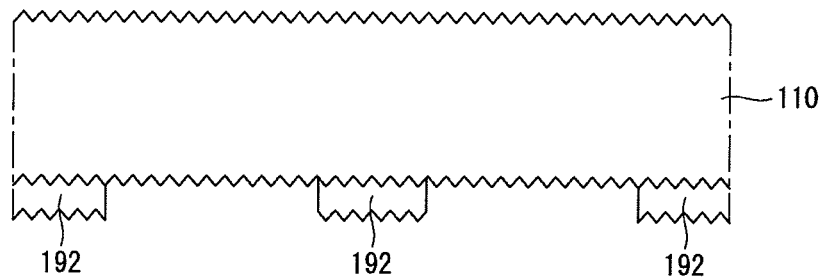

As shown in FIG. 16A, after forming a textured surfaces at a planar surface of a substrate 110, a passivation layer 192 is formed on the substrate 110 as described with reference to FIGS. 15B and 15C, as shown in FIG. 16B.

Figure 16C:
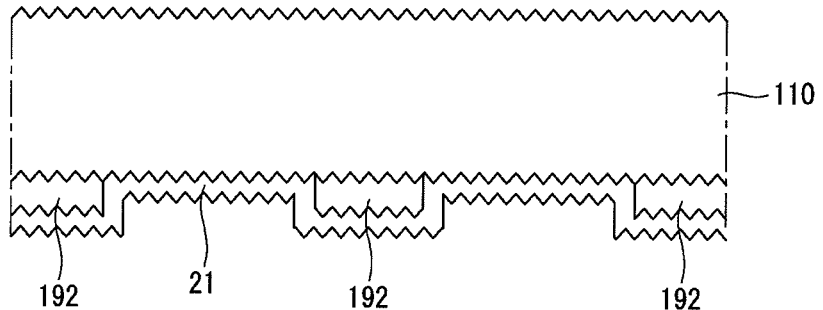
Figure 16D:
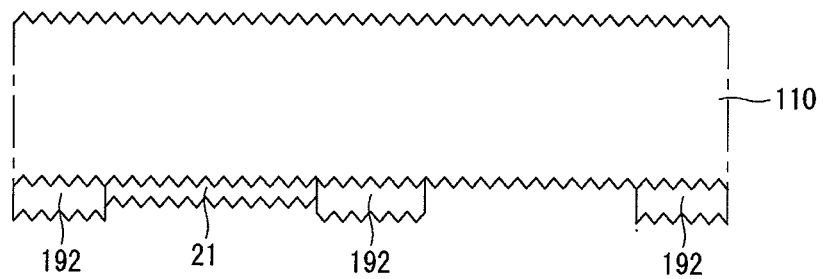
Figure 16E:
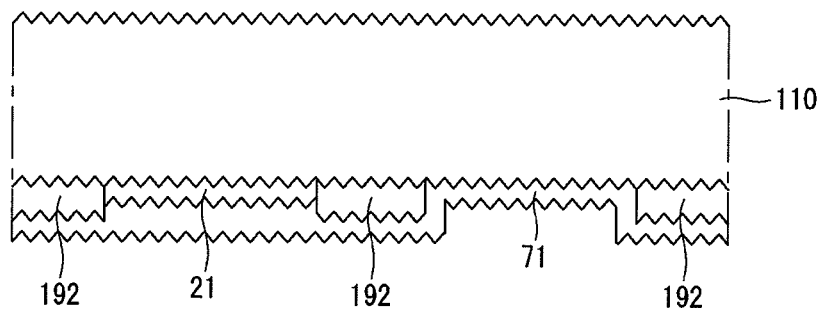
Figure 16F:
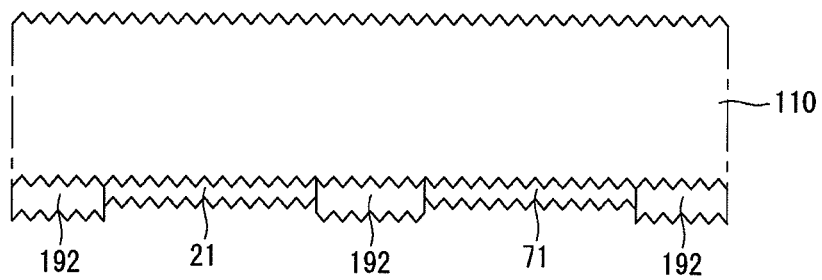

Next, referring to FIGS. 16C and 16D, after forming an emitter layer 21 of an n-type on the substrate 110 and the passivation layer 192, desired portions of the emitter layer 21 are removed, and as shown in FIGS. 16E and 16F, after forming BSF layer 71 of a p-type is formed on the substrate 110, the emitter layer 21 and the passivation layer 192, desired portions of the emitter layer 21 are removed. Thereby, as shown in FIG. 16F, two adjacent emitter layer 21 and the BSF layer 71 are electrically separated by the passivation layer 192.

In this example embodiment, the emitter layer 21 and the BSF layer 71 are not made of metal silicide such as amorphous metal silicide. However, in accordance with the characteristics of the emitter regions 122 or 122a-122c and the BSF regions 173 or 173a-173c shown in FIGS. 9 to 12, the emitter layer 21 and the BSF layer 71 may be an intrinsic amorphous silicon layer or/and an amorphous silicon layer of which an impurity doped concentration is linearly or nonlinearly changed from substantially 0 atoms/cm³ (i.e., an intrinsic amorphous silicon) to a predetermined impurity doped concentration in accordance with a thickness variation of the emitter regions 122 or 122a-122c and the BSF regions 173 or 173a-173c.

Figure 16G:
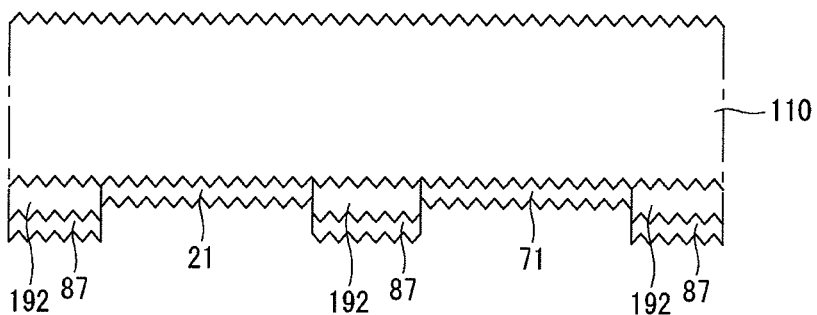

Next, an exposure prevention layer 87 is formed the entire back surface of the substrate 110, that is, the passivation layer 192, the emitter layer 21, and the BSF layer 71, and then portions of the exposure prevention layer 87, which are positioned on the passivation layer 192 are removed, to complete the exposure prevention layer 87 as shown in FIG. 16G.

Figure 16H:
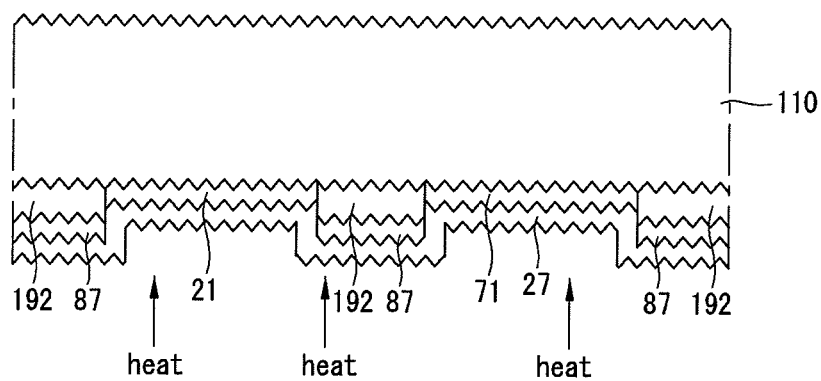
Figure 16I:
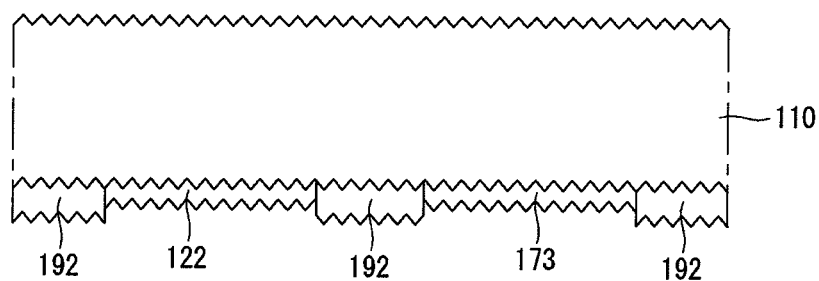

Next, referring to FIG. 16H, a metal layer 27 is formed on the emitter layer 21, the BSF layer 71, and the exposure prevention layer 87, and then is subjected to a thermal treatment, to form a plurality of emitter regions 122 and a plurality of BSF regions 173. In this instance, at least one portion of each emitter region 122 and at least one portion of each BSF region 173 come to be made of amorphous metal silicide.

As described above, since the plurality of emitter regions 122 and the plurality of BSF regions 173 containing amorphous metal silicide are formed by one thermal treatment, a deterioration of the substrate 110 due to multiple thermal treatments decreases and a manufacturing time of the solar cells 18-21 is reduced.

An anti-reflection layer 130 is formed on a front surface (i.e., an incident surface) of the substrate 110 to complete the solar cells 18-21 as shown in FIGS. 9 to 12.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
a substrate containing a first impurity of a first conductivity type and made of a crystalline semiconductor;
an emitter region positioned on the substrate and containing a second impurity of a second conductivity type different from the first conductivity type, the emitter region forming a heterojunction with the substrate;
an anti-reflection layer physically directly contacting the emitter region;
a surface field region positioned on the substrate and containing a third impurity of the first conductivity type, the surface field region forming a heterojunction with the substrate;
a first electrode passing through the anti-reflection layer and physically directly contacting the emitter region; and
a second electrode physically directly contacting the surface field region,
wherein at least one of the emitter region and the surface field region comprises an amorphous metal silicide layer containing a metal material comprising at least one of chromium (Cr), aluminum (Al), cobalt (Co), hafnium (Hf), molybdenum (Mo), nickel (Ni), lead (Pd), platinum (Pt), tantalum (Ta), titanium (Ti), tungsten (W), and zirconium (Zr),
wherein a concentration of the metal material contained in the at least one of the emitter region and the surface field region is $1\times10^{15}$ atoms/cm² to $1\times10^{21}$ atoms/cm²,
wherein the at least one of the emitter region and the surface field region comprises a first portion directly contacting the substrate and made of amorphous silicon configured to perform a passivation function and a second portion positioned on the first portion and made of the amorphous metal silicide layer configured to improve a transfer efficiency of charges,
wherein the first and second portions are doped with the second impurity or the third impurity, and
wherein the impurity doped concentrations of the first and second portions are $1\times10^{16}$ atoms/cm³ to $1\times10^{21}$ atoms/cm³.

2. The solar cell of claim 1, wherein the at least one of the emitter region and the surface field region has a resistance of $1\times10^{-6}$ to $1\times10^{-3}$ Ω-cm.

3. The solar cell of claim 1, wherein the first impurity is the same as the third impurity.

4. The solar cell of claim 1, wherein the first impurity is different from the third impurity.

5. The solar cell of claim 1, wherein the emitter region is positioned on an incident surface of the substrate, on which light is incident.

6. The solar cell of claim 5, wherein the surface field region is positioned on a surface of the substrate, which is opposite the incident surface of the substrate.

7. The solar cell of claim 1, wherein impurity doped concentrations of the first and second portions in a unit volume are equal to each other.

8. A solar cell, comprising:
a substrate having a first conductivity type and made of a crystalline semiconductor;
an emitter region positioned on the substrate and having a second conductivity type different from the first conductivity type, the emitter region forming a heterojunction with the substrate;
an anti-reflection layer physically directly contacting the emitter region;
a surface field region positioned on the substrate and having the first conductivity type, the surface field region forming a heterojunction with the substrate;
a first electrode passing through the anti-reflection layer and physically contacting the emitter region; and
a second electrode physically directly contacting the surface field region,
wherein at least one of the emitter region and the surface field region comprises an amorphous metal silicide layer containing a metal material comprising at least one of chromium (Cr), aluminum (Al), cobalt (Co), hafnium (Hf), molybdenum (Mo), nickel (Ni), lead (Pd), platinum (Pt), tantalum (Ta), titanium (Ti), tungsten (W), and zirconium (Zr),
wherein a concentration of the metal material contained in the at least one of the emitter region and the surface field region is $1\times10^{15}$ atoms/cm$^2$ to $1\times10^{21}$ atoms/cm$^2$,
wherein the at least one of the emitter region and the surface field region comprises a first portion directly contacting the substrate and made of amorphous silicon configured to perform a passivation function and a second portion positioned on the first portion and made of the amorphous metal silicide layer configured to improve a transfer efficiency of charges,
wherein the first and second portions are doped with an impurity, and
wherein the impurity doped concentrations of the first and second portions are $1\times10^{16}$ atoms/cm$^3$ to $1\times10^{21}$ atoms/cm$^3$.

* * * * *